United States Patent [19]

Werdin et al.

[11] Patent Number: 4,751,613
[45] Date of Patent: Jun. 14, 1988

[54] LOW RF EMISSION FIBER OPTIC TRANSMISSION SYSTEM

[75] Inventors: David A. Werdin; Reinhold Henke, both of St. Paul, Minn.

[73] Assignee: ADC Telecommunications, Inc., Minneapolis, Minn.

[21] Appl. No.: 54,080

[22] Filed: May 21, 1987

Related U.S. Application Data

[63] Continuation of Ser. No. 868,391, May 28, 1986, abandoned.

[51] Int. Cl.$^4$ ............................................. H05K 7/04
[52] U.S. Cl. .................................. 361/424; 361/414; 361/415
[58] Field of Search .............. 174/68.5, 35 R, 35 M, 174/35 S; 361/390, 391, 392-395, 399, 412, 413, 415, 414, 424

[56] References Cited

U.S. PATENT DOCUMENTS 4,399,487  8/1983  Neumann ........................... 361/394
4,479,263 10/1984  Rosenfeldt ......................... 361/391
4,631,641 12/1986  Brombal ............................ 361/424

Primary Examiner—G. P. Tolin
Attorney, Agent, or Firm—Merchant, Gould, Smith, Edell, Welter & Schmidt

[57] ABSTRACT

An electrical to fiber optic conversion unit for use in a fiber optic transmission link includes a ferrous metal chassis with an open front end for receiving a plurality of conversion modules and power supply or test modules. The conversion module includes circuitry for converting electrical signals to fiber optic signals and is constructed of a multi-layer printed circuit board having top and bottom layers substantially covered with a non-current conducting chassis ground. The several internal layers of the conversion PC board include two signal layers for interconnecting components on the board, with the signal layers being separated by a power distribution layer and an interconnect layer for connecting components on opposite ends of the board. The multi-layer PC construction suppresses RF noise from the conversion module providing that the front panel of the module may be left uncovered while still achieving very low levels of RF emission.

20 Claims, 53 Drawing Sheets

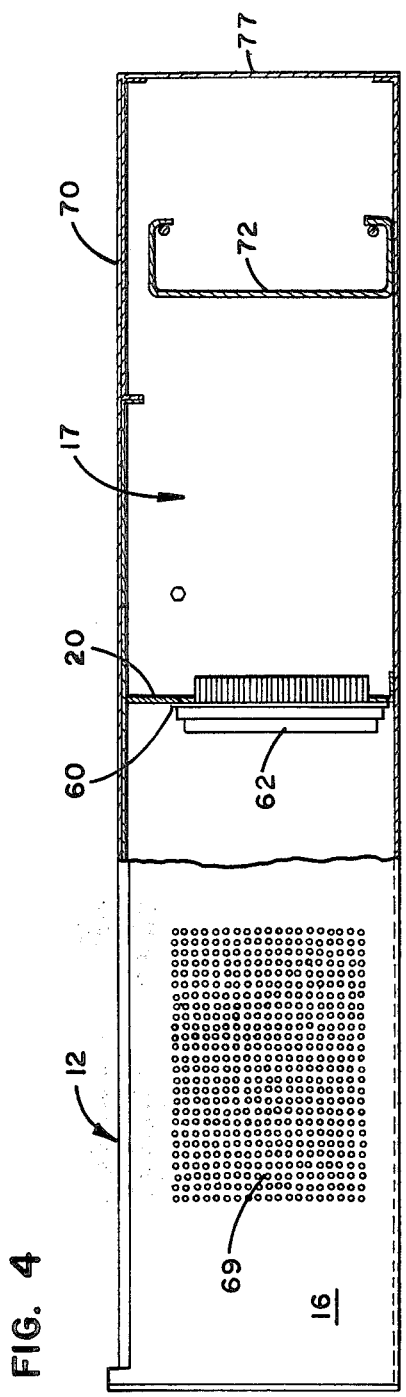

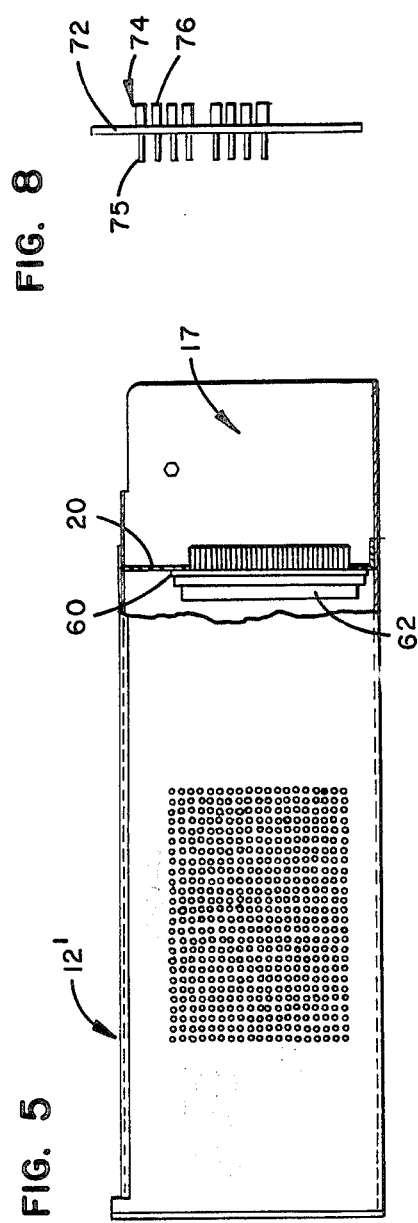

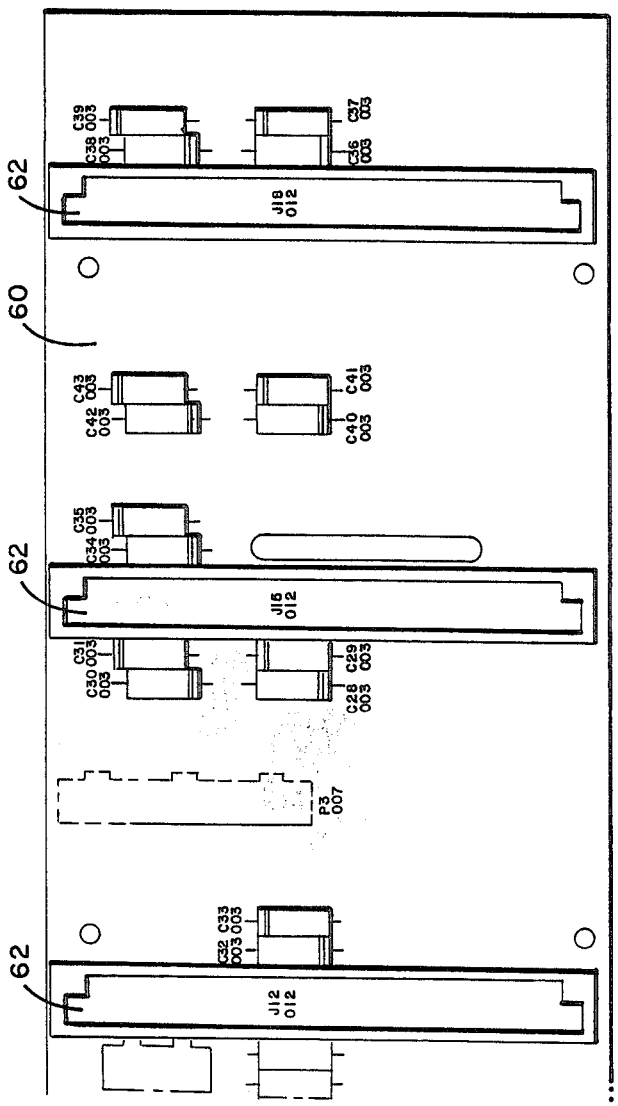

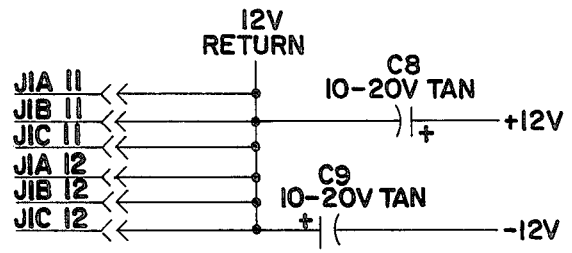
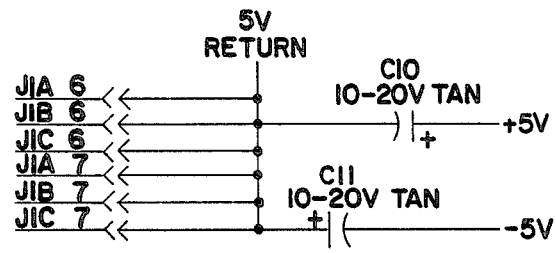
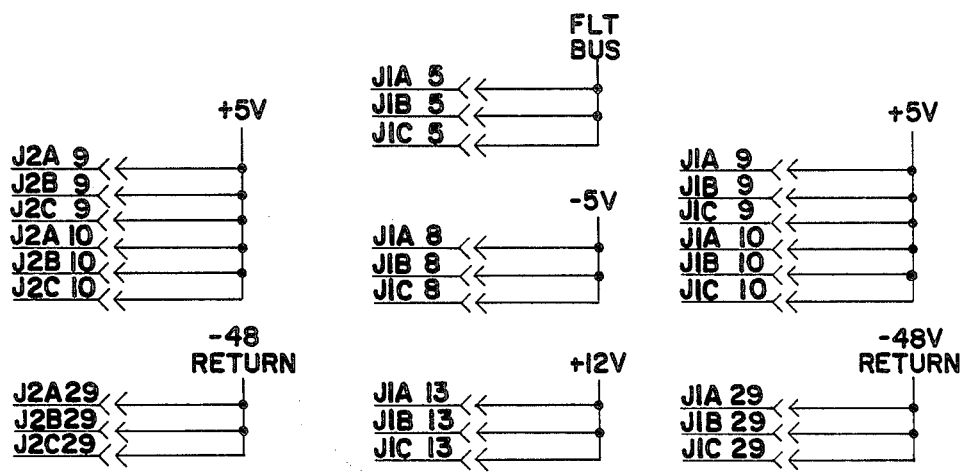
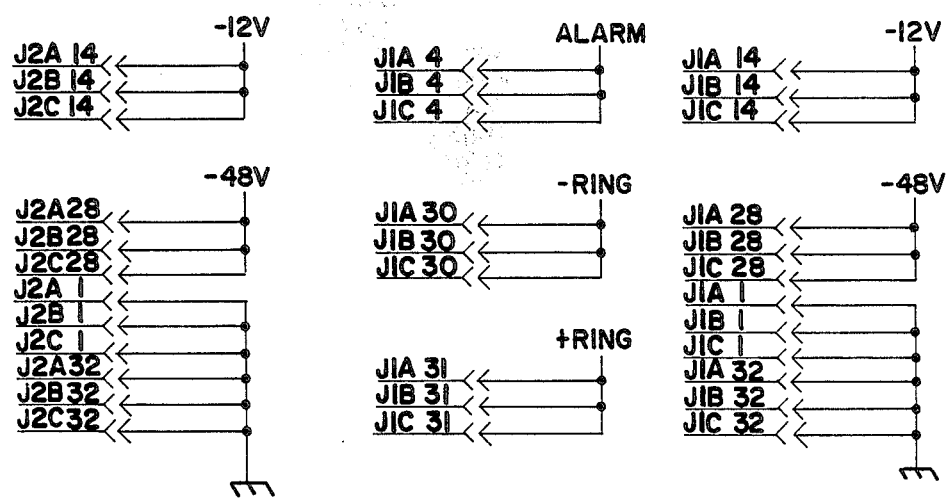
FIG. 18

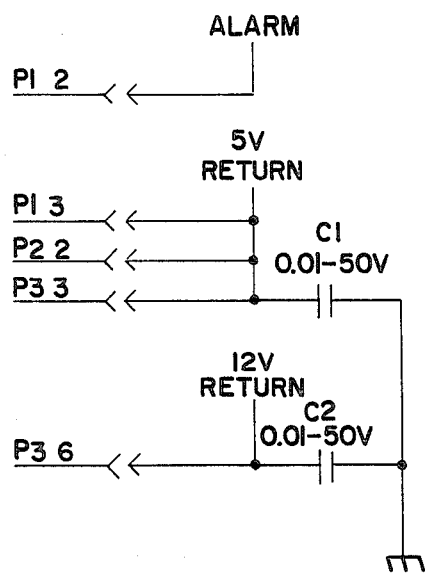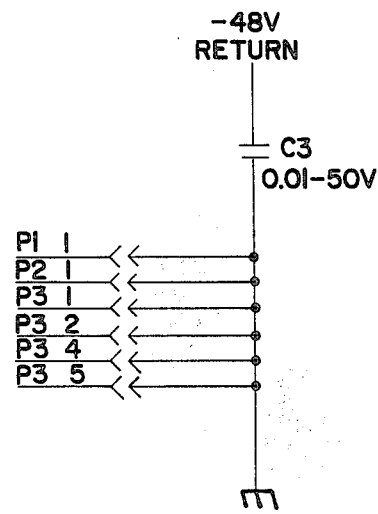
FIG. 19

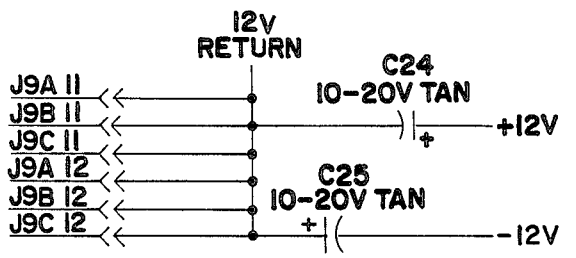
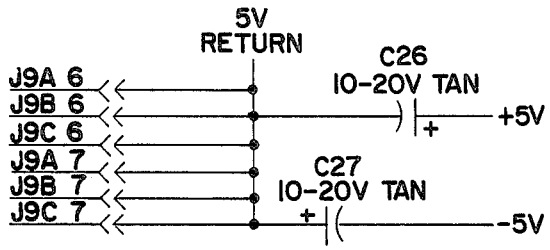
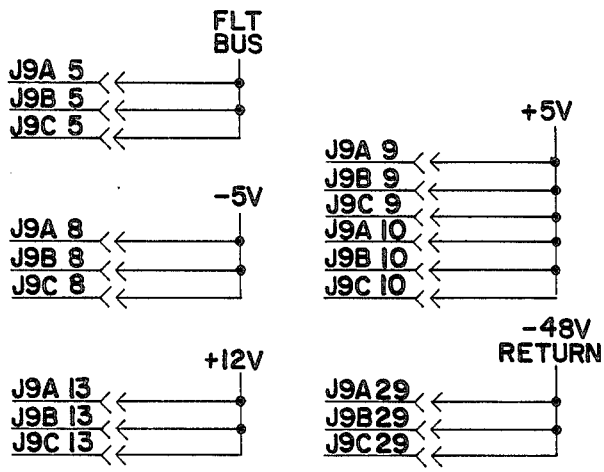
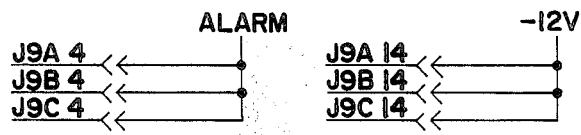
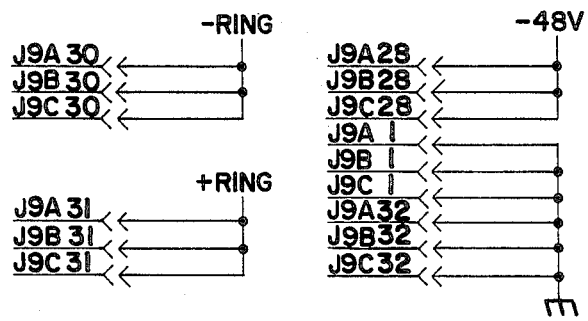
FIG. 24

FIG. 30

| | VCC | V− | ⏚ 5V RETURN | ⏚ CHASSIS GND | ⏚ 12V RETURN |
|---|---|---|---|---|---|
| REF DES | +5V | −5V | | | |
| U1 | 24 | | 12 | | |
| U2 | 16 | | 8 | | |
| U3 | 14 | | 7 | | |
| U4 | | | | | |
| U5 | 14 | | 7 | | |
| U6 | 16 | | 8 | | |
| U7 | 16 | | 8 | | |
| U8 | 16 | | 8 | | |
| U9 | 16 | | 8 | | |
| U10 | 16 | | 8 | | |
| U11 | 24 | | 12 | | |
| U12 | | | | | |
| U13 | 16 | | 8 | | |
| U14 | 16 | | 8 | | |
| U15 | 14 | | 7 | | |
| U16 | 1 | 8 | 5 | | |
| U17 | 1 | 8 | 5 | | |
| U18 | 16 | | 8 | | |
| U19 | | | | | |
| U20 | 16 | | 8 | | |
| U21 | 16 | | 8 | | |
| U22 | 14 | | 7 | | |
| U23 | 14 | | 7 | | |
| U24 | | | | | |
| U25 | | | | | |
| U26 | | | | | |
| U27 | | | | | |
| U28 | | | | | |

FLOATED PINS

FIG. 42A
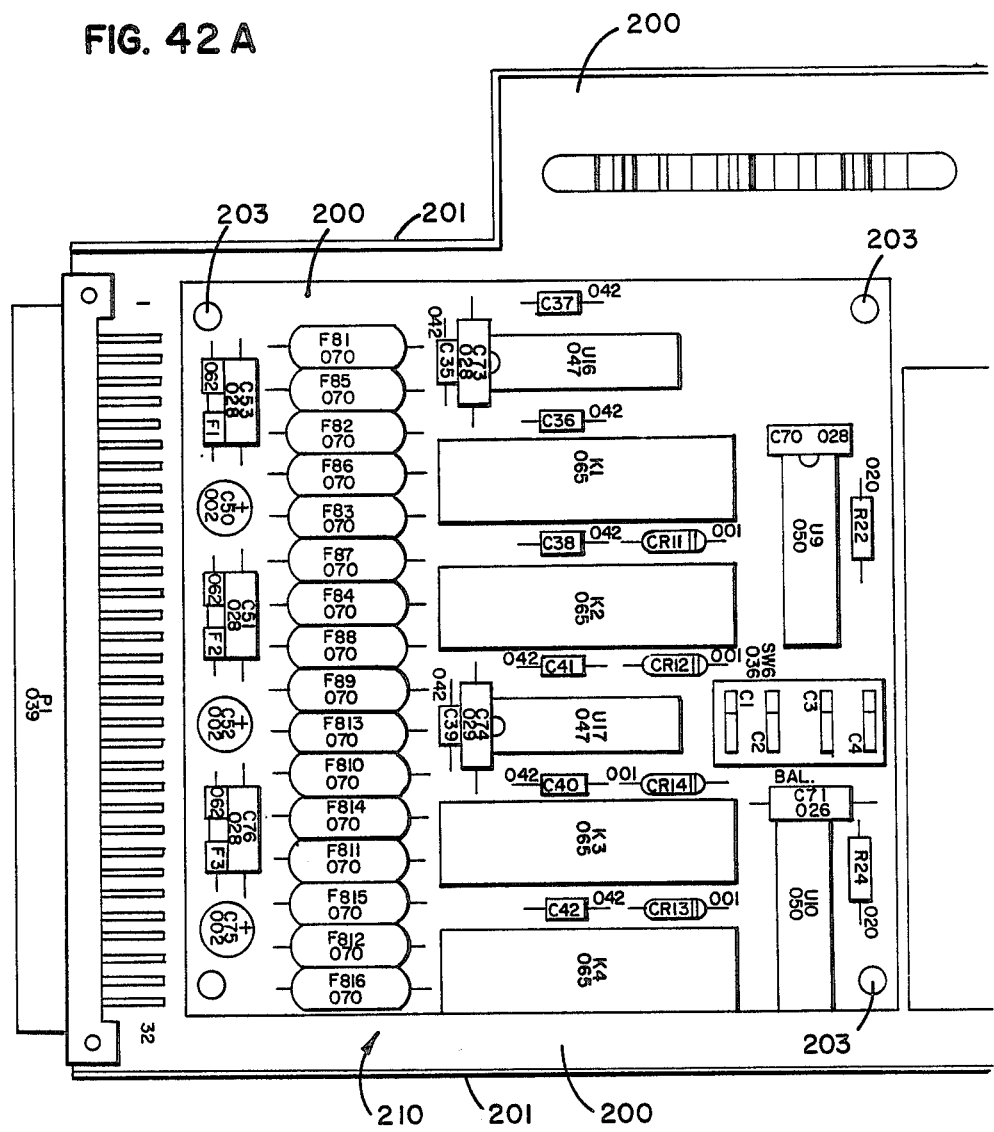
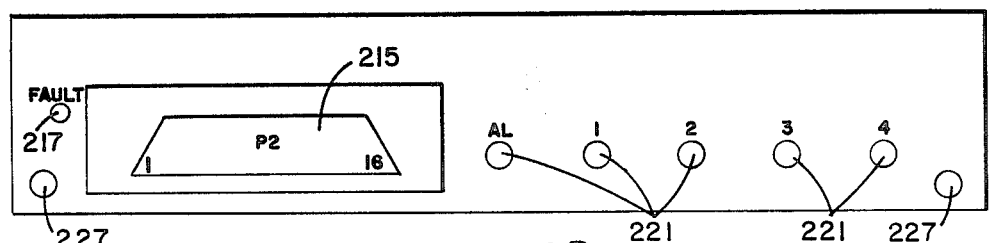
FIG. 42D

LOW RF EMISSION FIBER OPTIC TRANSMISSION SYSTEM

This is a continuation, of application Ser. No. 868,391, filed 5/28/86, and now abandoned.

TECHNICAL FIELD OF THE INVENTION

The present invention relates generally to the field of telecommunications and more particularly to the art of electrical to optical conversion and fiber optic transmission in low RF emission standards environments.

BACKGROUND OF THE INVENTION

Fiber optic transmission of sensitive information is now widely used by security-conscious government and military agencies because of the extremely low RF emission characteristics and resistance to tapping of fiber optics as compared to conventional copper connections. The conversion interface of the wired connections with the fiber optic system remains, however, a source of RF radiation which must be carefully controlled in order to assure adequate data security. Accordingly, organizations like the National Security Agency (NSA) require interface equipment to meet stringent RF emission standards, for instance the TEMPEST requirements.

In the past, the conventional approach to achieving very low levels of RF emmissions from a conversion interface has been one of containment, wherein the interface unit is totally enclosed to prevent RF radiation from escaping. This strategy has generally required that the front end and front access panels of the unit be sealed closed with a cover using RF gaskets. Thus, accessing the front panels of the interface circuitry has required that the cover be removed, resulting in undesirable RF emission while the unit is open. Furthermore, it is known to often happen that technicians fail to properly resecure the cover after front panel access, resulting in a loss of compliance with the desired standards, and a possible security compromise.

SUMMARY OF THE INVENTION

The present invention departs from the prior art strategy to provide a low RF emission conversion unit which provides an uncovered front panel while maintaining low RF emmission characteristics. To do so, the present invention combines an emission supression strategy in the internal circuit modules with a modified conventional containment strategy, thus allowing for the desired unimpeded front panel access for testing, monitoring and repair without the substantial loss of data security incumbent with prior art designs.

With respect to the particulars of the present invention, there is provided a unit housing having an open front end for receiving modules for data conversion, testing or power supply. The rear and sides of the housing are constructed of ferrous metal for emissions containment. Each of the modules mounted in the housing includes a front panel also constructed of ferrous material, and are sized to fit snugly against adjacent panels, whereby a substantially continuous emission containment front cover is provided by the panels mounted accross the front end of the housing.

In order to minimize RF emission from the internal circuitry, the data handling modules comprise multilayer printed circuit boards which provide that the most prevalent sources of RF emission are sandwiched between layers including substantial ground plane surface area and that long signal runs are also substantially surrounded by ground plane Moreover, the module power planes are provided with independent ground returns to minimize coupling with other ground connections, whereby the crosstalk and antenna effects are reduced.

Thus, the present invention combines an RF emission suppression strategy with conventional containment strategies to allow for an uncovered front panel which has heretofore not been considered feasible. These and other salient aspects of the invention, together with the other more subtle aspects thereof will be discussed in more detail below with respect to the drawings.

BRIEF DESCRIPTION OF THE DRAWINGS

FIGS. 1-8 show the conversion unit chassis and module arrangement according to the present invention;

FIGS. 9-28 illustrate the construction of the motherboard according to the present invention;

FIGS. 30-41 show the electrical schematic diagram of the low speed channel multiplexer according to the present invention;

FIGS. 42A-D show the component layout and assembly of a multiplexing module according to the present invention;

DETAILED DESCRIPTION OF THE INVENTION

The present invention provides a fiber optic transmission link between electrical input/output (I/O) equipment. The typical use for such equipment is in government and military installations where RF radiation is sought to be minimized in order to reduce or eliminate the likelihood that data transmissions may be intercepted by adverse intelligence organizations. The present invention thus provides for converting electrical signals, for example as taken from a MIL-188, RS 232, RS 422 or RS 423 interface, and converting or encoding them to optical pulses which may be transmitted over low RF emission fiber optic links, which additionally have the benefit of being fairly tap-resistant. Thus, the electrical/fiber optic aspect of the present invention basically comprises data encoder/decoder conversion circuitry interfacing with the electrical cables on either end of the fiber optic link, which may thus be run from one end of a building to another, or from building to building in an installation or compound.

Although the fiber optic link itself is relatively low in RF emission, the interface between the link and the electrical cables, which are typically shielded to guard against RF radiation, must be carefully handled or it becomes a significant source of RF emission itself. As mentioned above in the Background section hereof, the prior art approach to the problem of the interface unit has been to contain the RF emission by encasing essentially the entire interface, encoder/decoder conversion circuits and all in a sealed ferrous metal container. However, as also mentioned above, this is problematic in terms of accessing the various circuits and lines for monitoring, repair or testing. The present invention, on the other hand, has incorporated a signal suppression approach with a modified containment strategy in order to provide unfettered front panel access.

Figure 1:
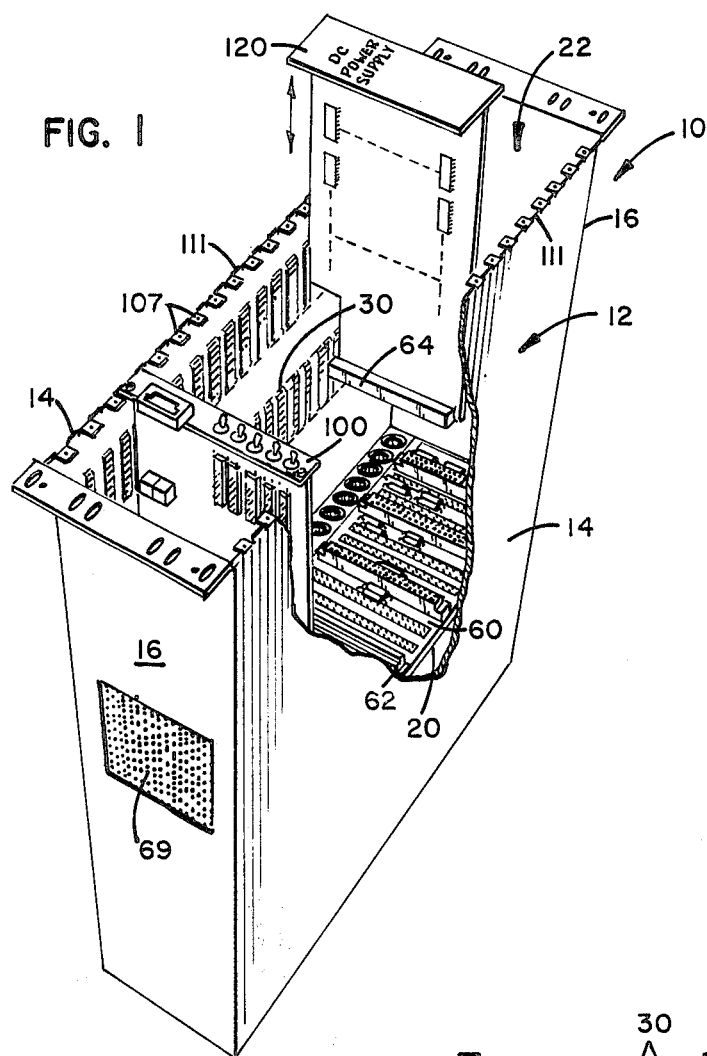
Figure 7:
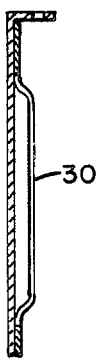
Figure 6:
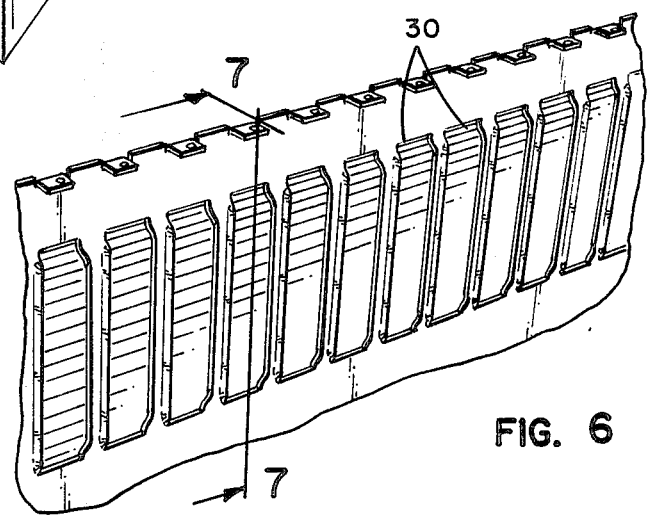

Referring now to FIGS. 1 through 7 the overall aspects of the invention will be described. In FIG. 1 there is shown a perspective view of the interface/conversion unit 10. The interface unit 10 includes a housing/chassis 12 having top and bottom walls 14 and sidewalls 16. An internal rear panel 20 is mounted to extend across the rear end of the chassis in order to generally define a signal containment area 22. The rear panel and walls of unit 10 are preferably formed from heavy 0.060 to 0.075 inch zinc or zinc chromate plated cold rolled ferrous steel. The front end of area 22 is covered by the various front panels of card modules 50, or with blanks, as may be seen with respect to the front view of FIG. 2.

As may be seen best with respect to FIGS. 1, 3, 6 and 7, the chassis 12 includes a plurality of card guides 30 which are formed from a single sheet of sheet metal and fixed to the top and bottom walls 14 to provide cooperating guides. As may be seen with respect to FIG. 1, a card module 50 may thus be mounted in the chassis 12 by sliding it in. As will be explained in more detail below each card module 50 comprises a printed circuit board mounted to a sheet metal support of roughly the same outline so that the sheet metal support slides in the card guides. The front panels of each of card modules 50 are spot welded to the metal support, and the printed circuit boards are mounted to the support with metal stand-offs.

Figure 3:
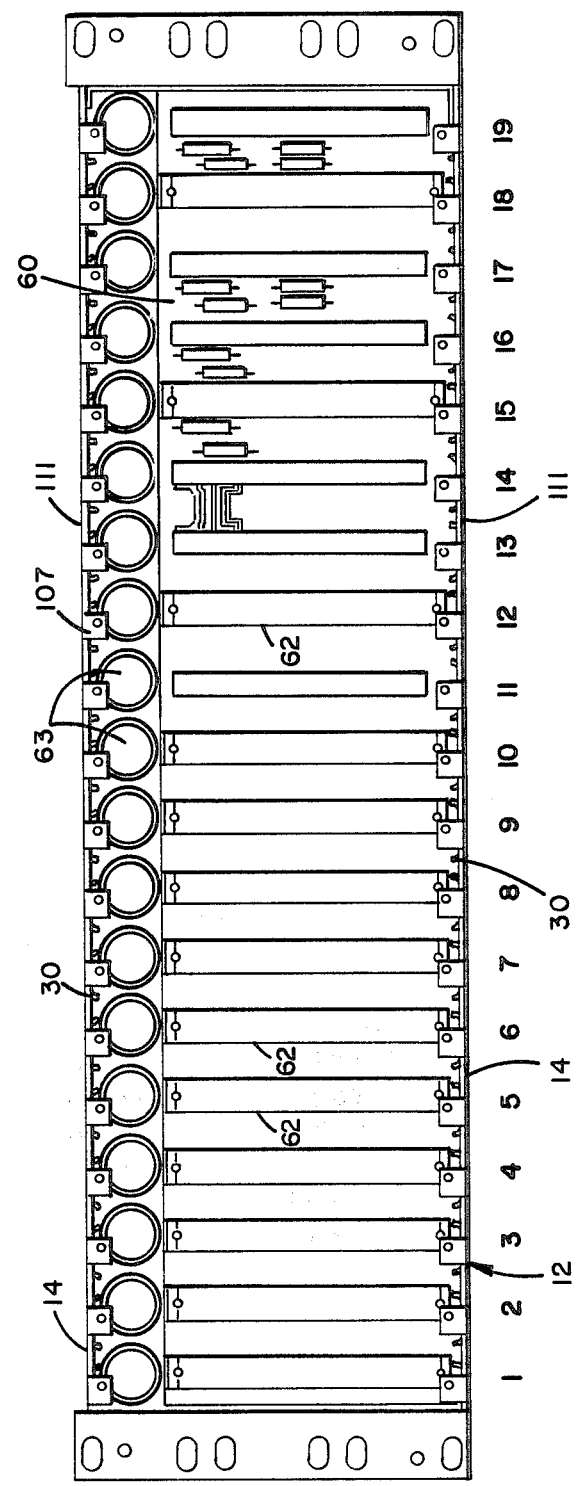

As may be generally seen with respect to FIGS. 3 and 4, the internal rear panel 20 supports a motherboard 60, which includes a plurality of connectors 62 for receiving a mating DIN connector 64 of the modules 50. Motherboard 60 provides for power bus supply to the modules 50 and any other necessary bussing or connection between modules. Thus, a module inserted in the chassis 12 mates with a corresponding slot in the motherboard 60.

As may be seen with respect to FIG. 4, the connectors 62 extend through panel 20 to provide a contact or connection point outside the containment area in the rear area 17 of the chassis 12. Thus, electrical cables may be connected to the modules by connection to the exposed side of connectors 62, which, where the connectors need to be connected to outside data lines are preferably 96 Pin DIN connectors with a male having long tails. Otherwise, connectors 62 may be female DIN connectors, as for instance is used in the case of the power supply module slots.

As may be seen in FIG. 3, rear panel 20 preferably includes a plurality of fiber optic cable openings 63 through which the fiber optic link cables may be run to and from conversion circuit modules. Furthermore, as may be seen in FIGS. 1, 4 and 5, the chassis 12 includes a plurality of vent holes which are also designed to allow for cooling of the unit while inhibiting RF emission, as is conventionally done. For this purpose is has been found desirable to use double thick walls to achieve vent-hole dimensions sufficient to filter high frequencies.

The embodiment of the chassis 12 shown in FIGS. 1 and 4 includes an enclosed extension 70, within which there is mounted a quick connect panel 72. As shown in FIG. 8, panel 72 carries a plurality of quick connectors (QCP) 74 which include wire wrap pins 75 on one side and split cylinder connectors 76 on the opposite end.

Accordingly chassis 12 provides that electrical cross connection of incoming or outgoing lines may be accomplished inside the chassis to contain emmission. As shown in FIG. 4, the rear end of chassis 12 is fully enclosed, and includes a rear cover 77 which may be removed. Electrical and fiber optic cable entry and exit is preferably accomplished by cutting aperatures in the rear area and mounting the cable carrying conduit directly to the chassis, whereby the incoming and outgoing lines are fully shielded.

In FIG. 5 there is shown an alternate, less secure embodiment of chassis 12 in which the top and end of the chassis, rear of the rear panel 20, is left open. Preferably, there is also provided in this embodiment a QCP field or other connection system, for instance a DV 25 connector. This embodiment may be used if desired where less data security is required.

Figure 2:
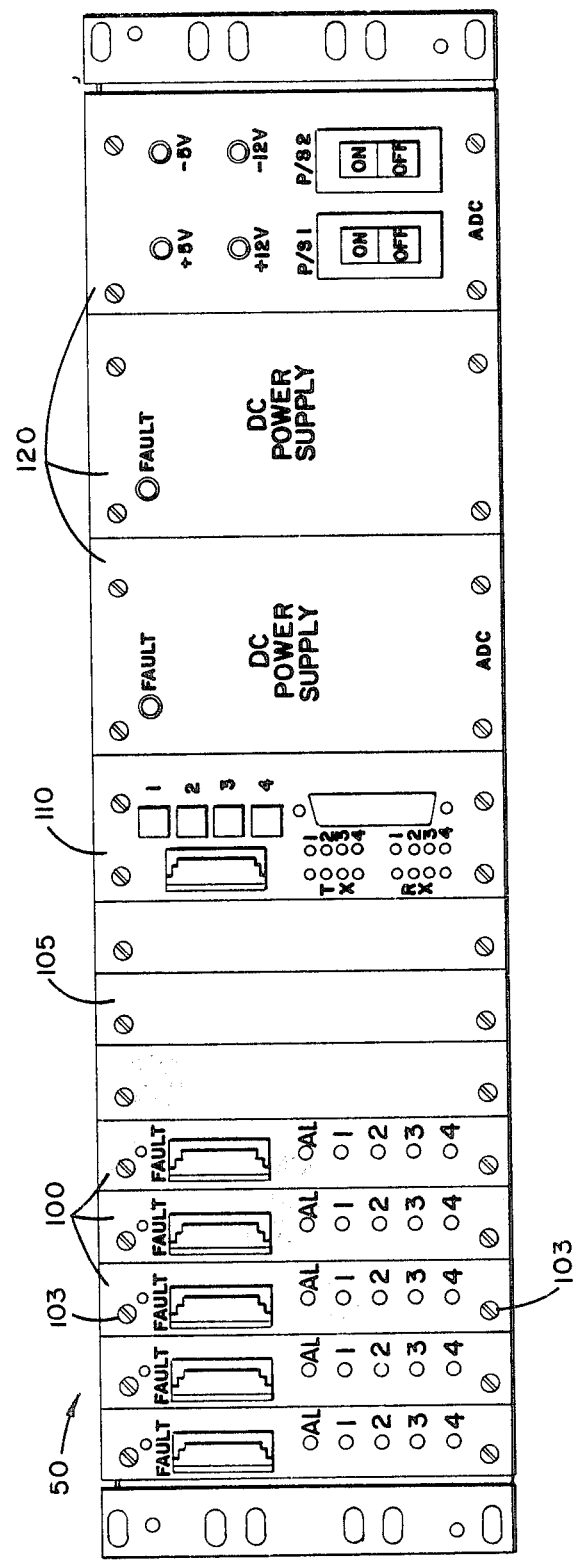

As may be seen with respect to FIG. 2, the present inventions allows for modules of different types. On the left side of FIG. 2 there is shown five conversion modules 100 which in this instance are low speed four channel digital multiplexing modules which take a plurality of MIL 188, RS 232, RS 422 or RS 423 type signals and multiplex them onto a single fiber optic line. A further type of module 110, a test module, is also provided and has a double-wide front panel. Test module 110 may be connected to any one of modules 100 to accomplish certain basic test functions. In between modules 100 and 110 there are installed a plurality of front panel blanks 105, which serve to cover the unused front panel portion of the chassis and thus contain RF emission. Modules 120 are all power supply modules, which connect to the motherboard in the same manner as the other modules except that the motherboard includes female as opposed to male connectors for reasons of safety, although they have triple-wide front panels. As shown, each module front panel or blank includes screws 103 which mate with the threaded tabs 107 on the chassis. Preferably, the front edge 111 of the chassis 12 is formed so that when a panel is secured in place it is substantially flush with the edge, to give as tight a metal-to-metal seal as possible. Futhermore, as mentioned above, it is important that the front panels of the modules be formed with as straight of edges and with tight tolerances to provide a close, interference type fit between one another across the front of the chassis 12.

As mentioned above, the present invention utilizes a signal radiation suppression strategy in order to minimize total RF emission from the interface chassis. It has been found that this is necessary with respect to those circuit modules which normally carry data, specifically modules 100. Although test module 110 also carries data at certain times, the line or lines which are to be tested must normally be secured, i.e., sensitive data transmissions are halted before testing, so that there is no particular need to suppress radiation from this source. Likewise, power supply units do not carry data and thus do not require special design. Thus, the power supply units are not specifically illustrated, and any conventional low-noise supply capable of delivering the desired power will suffice. As will be described below, however, modules 100, and to some extent motherboard 60 are specially designed to suppress RF radiation therefrom or therethrough.

Figure 9:
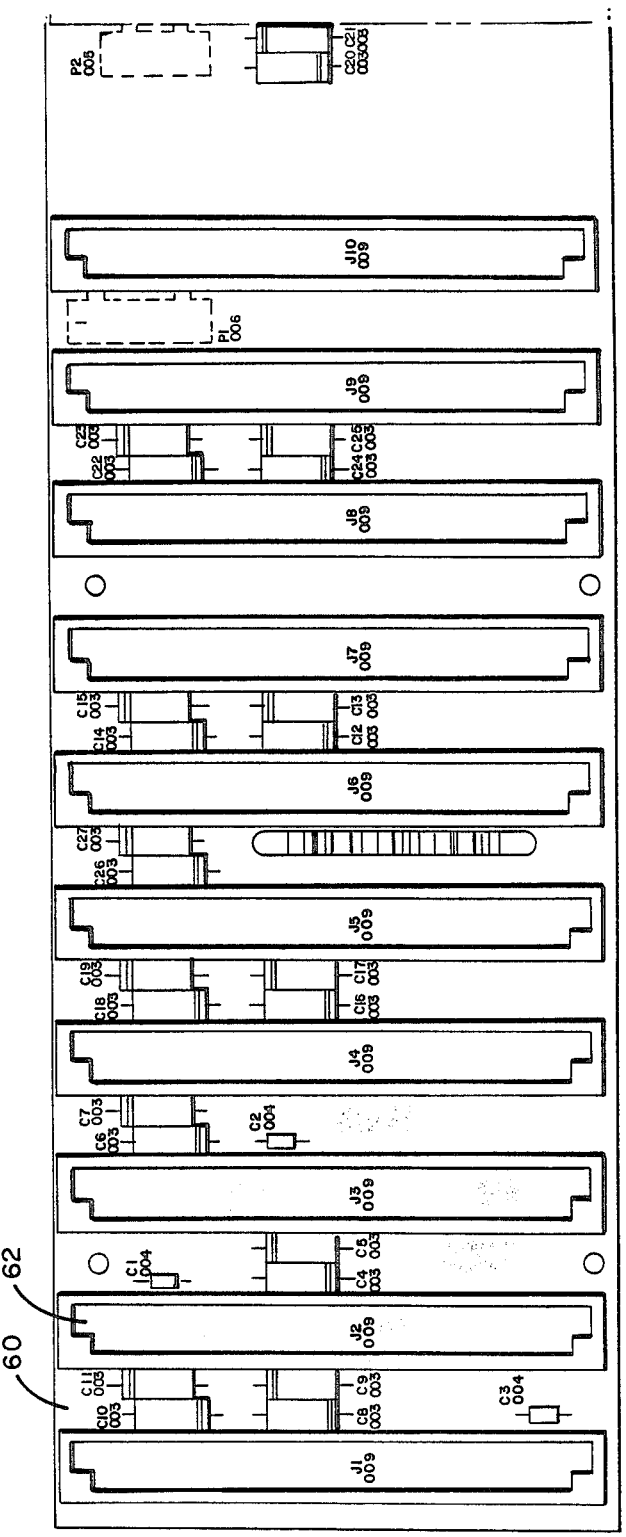
Figure 12:
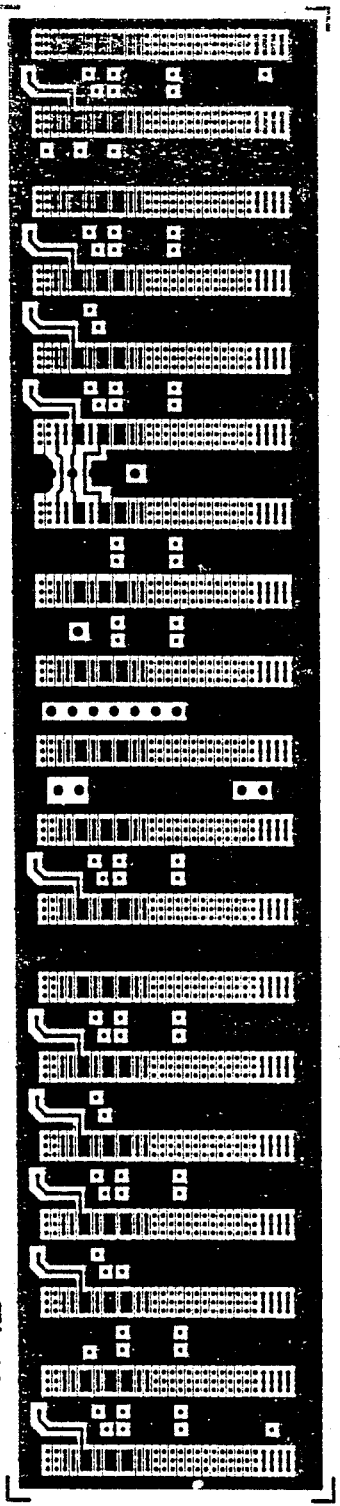
Figure 13:
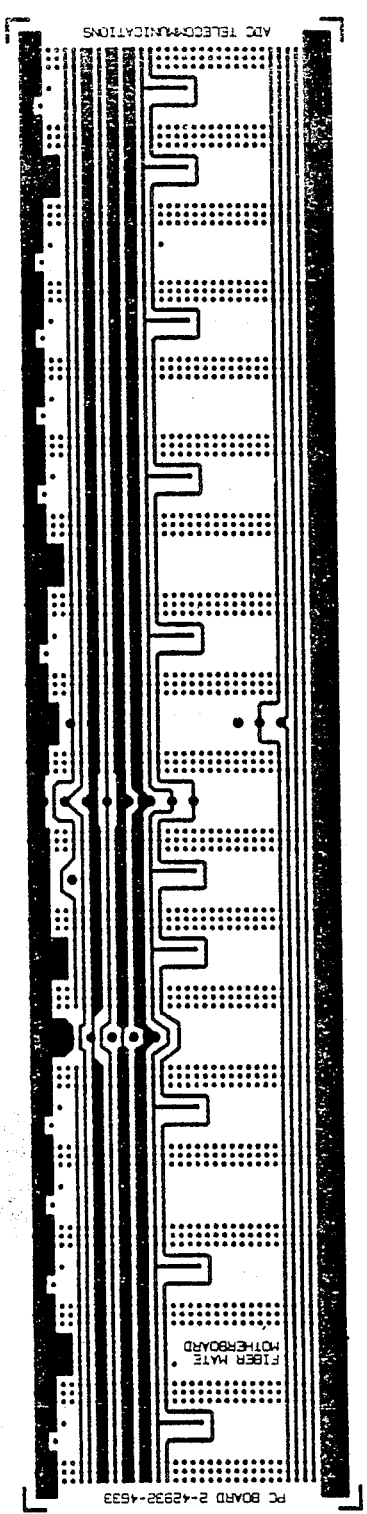
Figure 14:
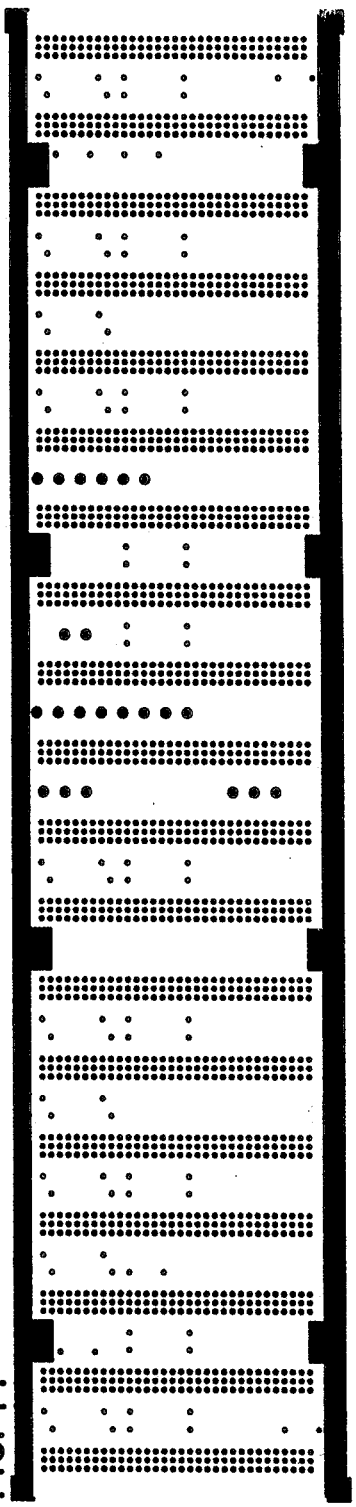
Figure 15:
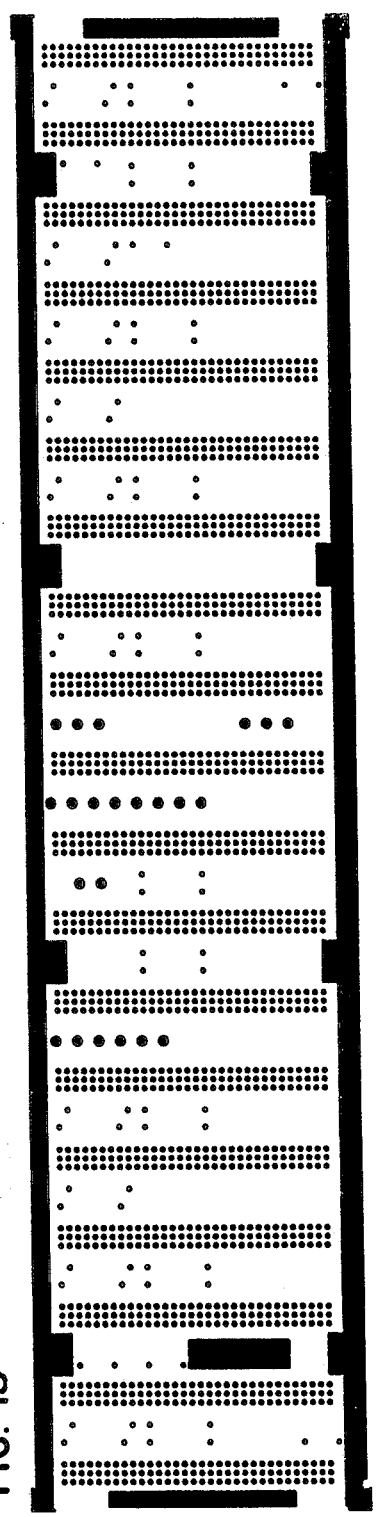
Figure 16:
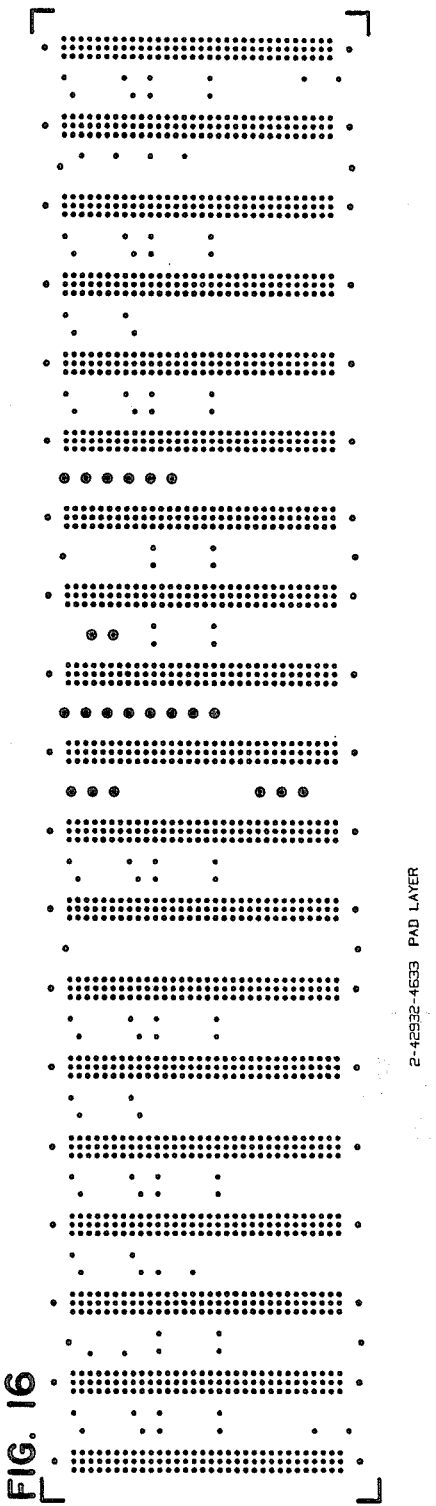
Figure 17:
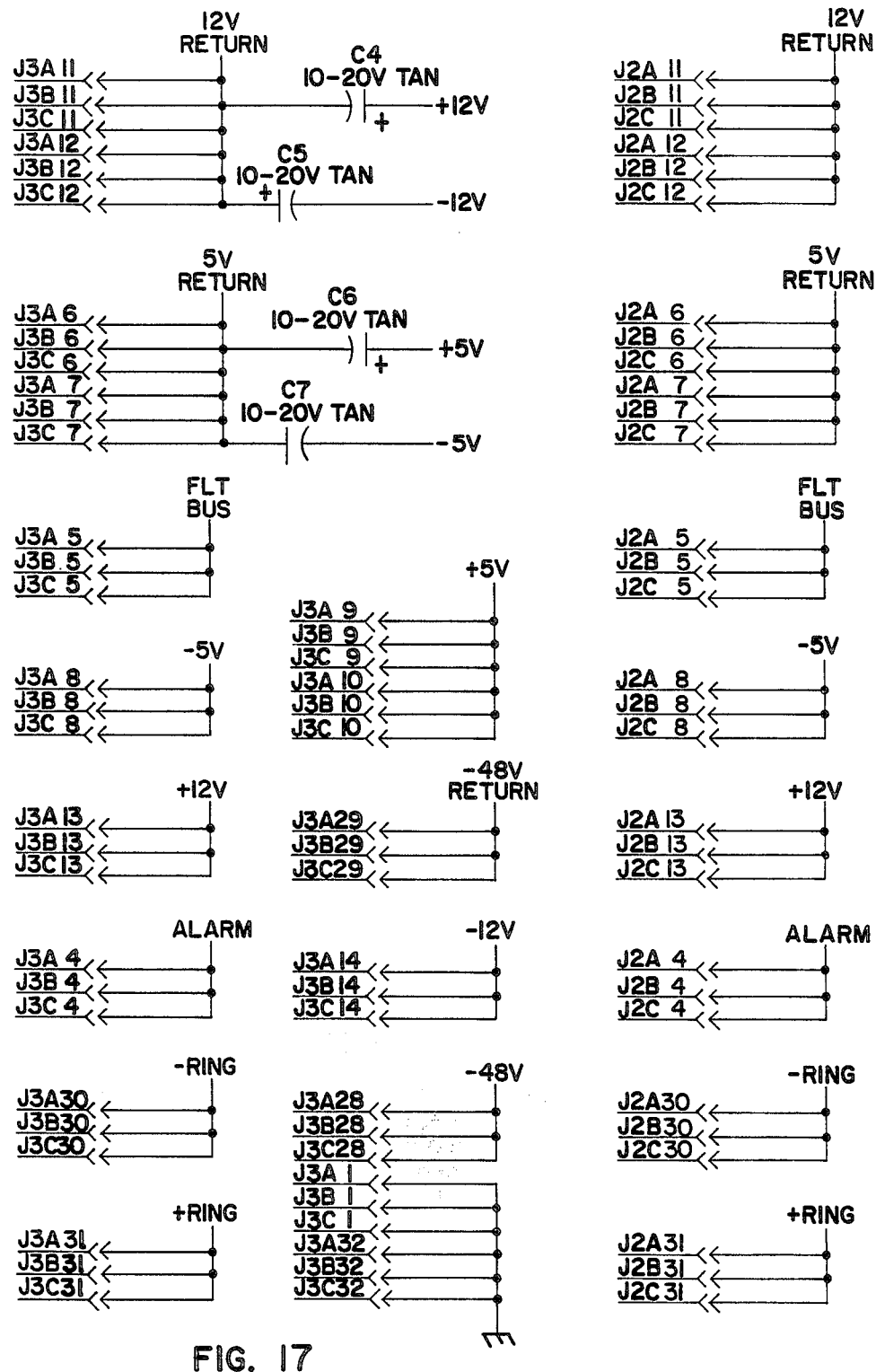
Figure 20:
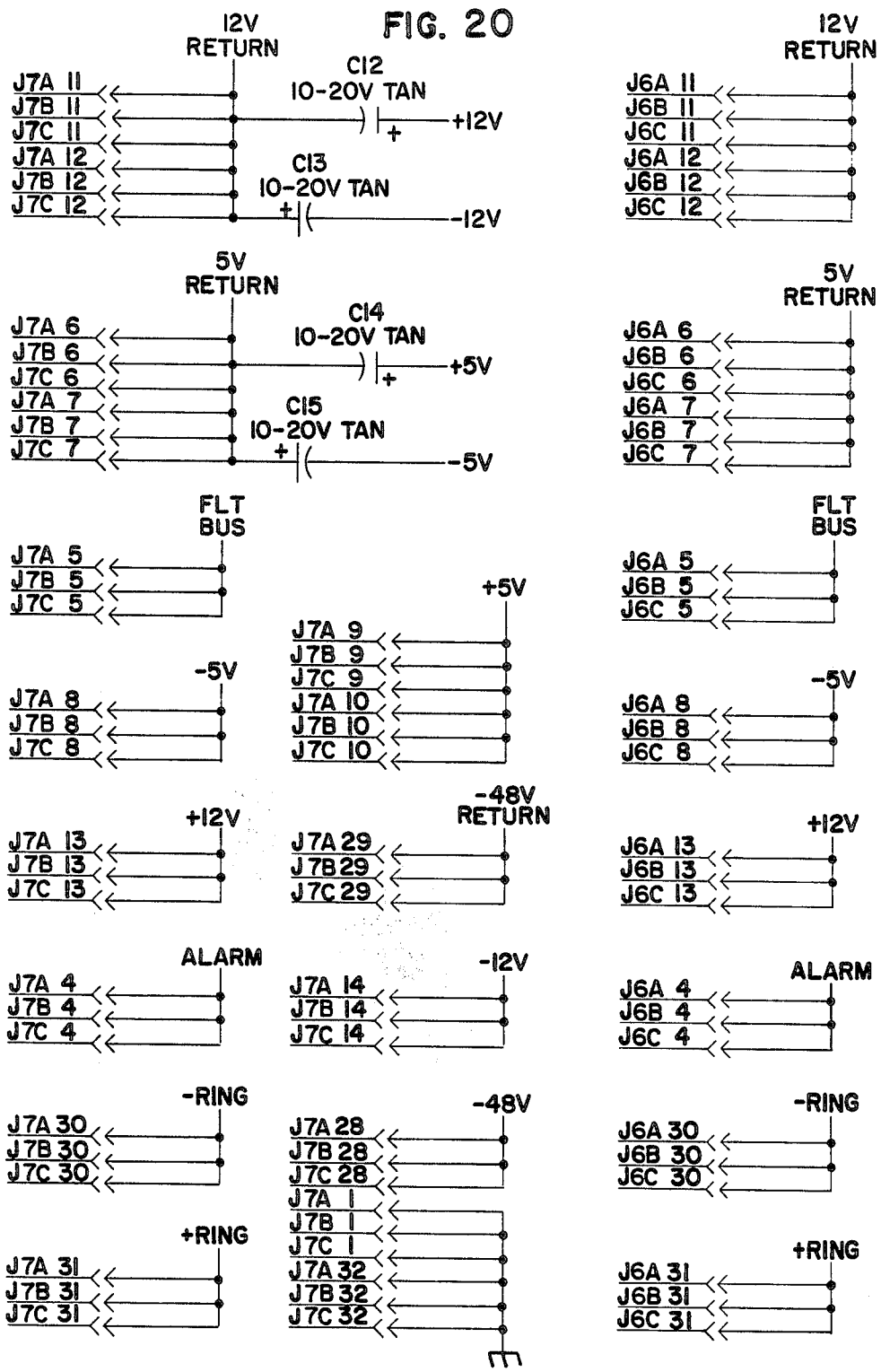
Figure 21:
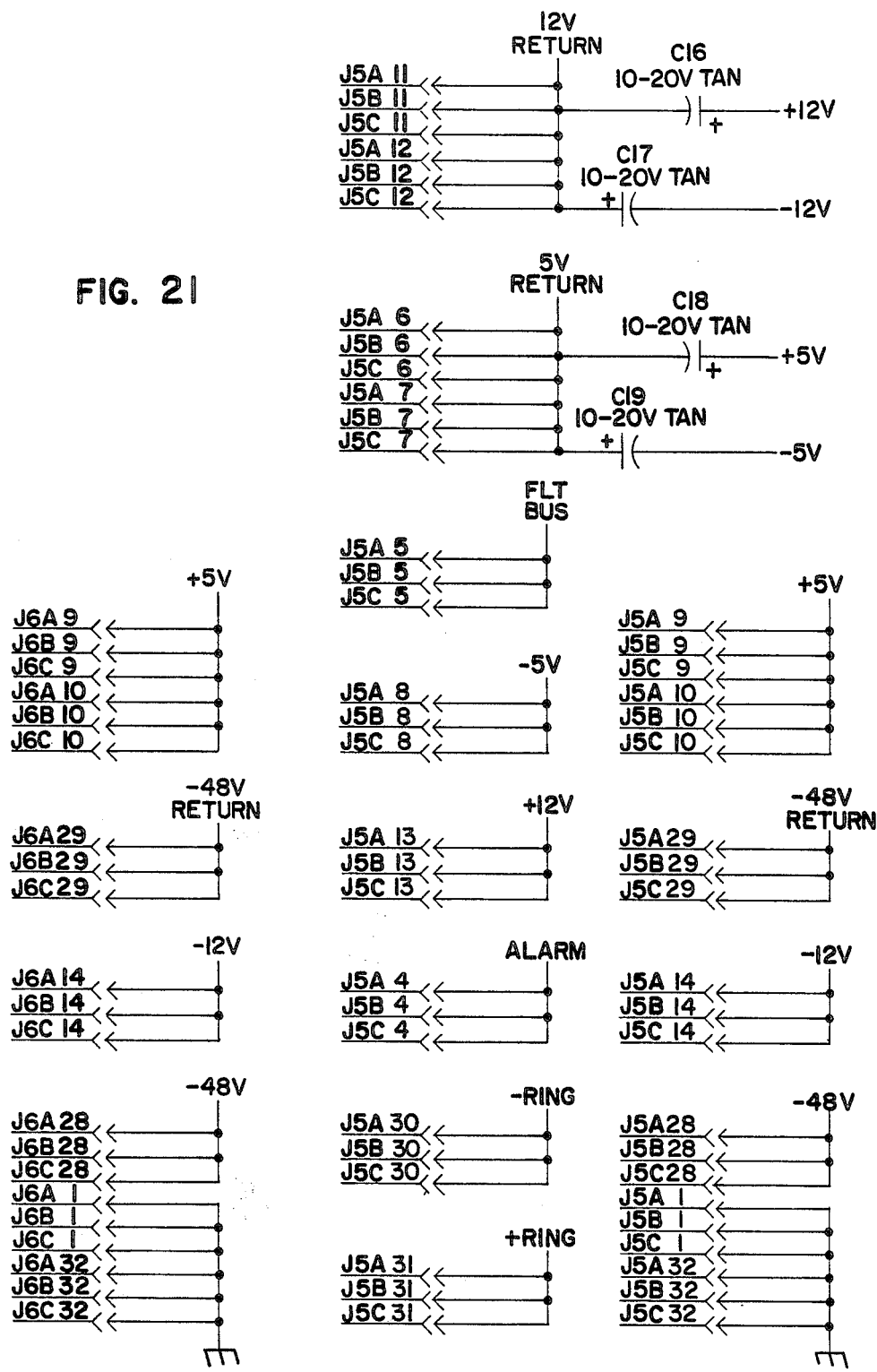
Figure 22:
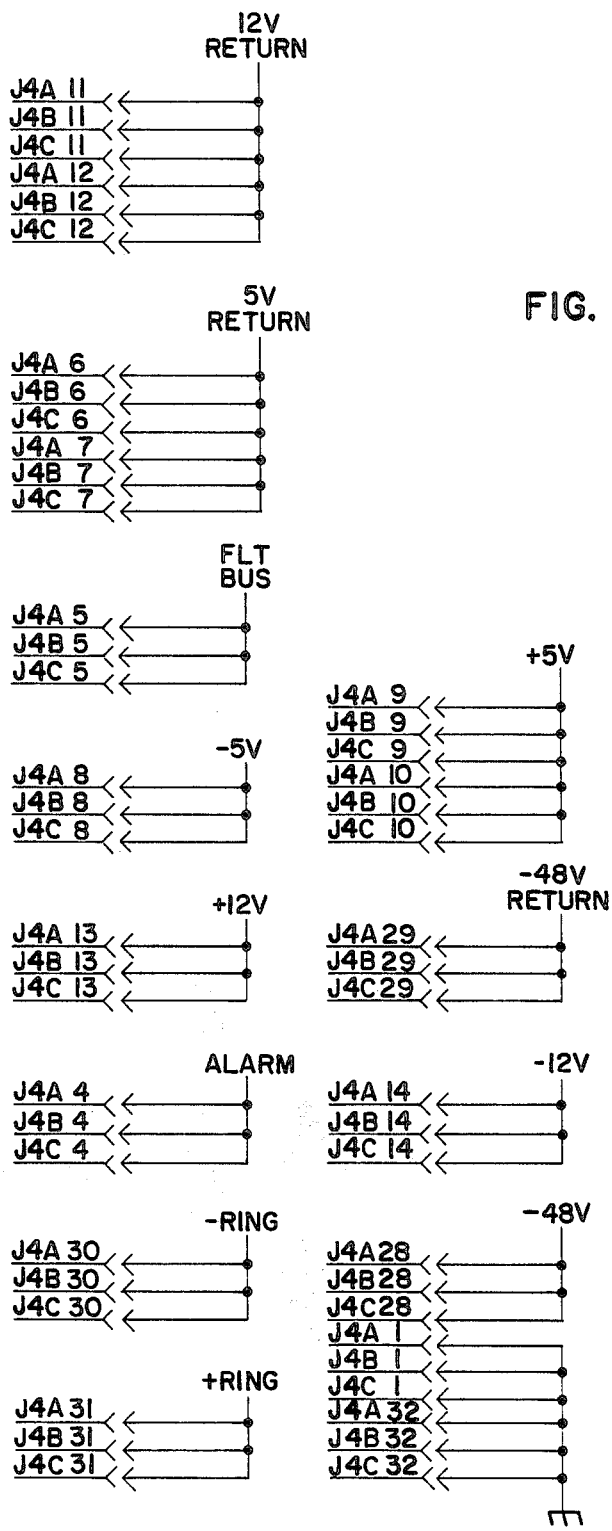
Figure 23:
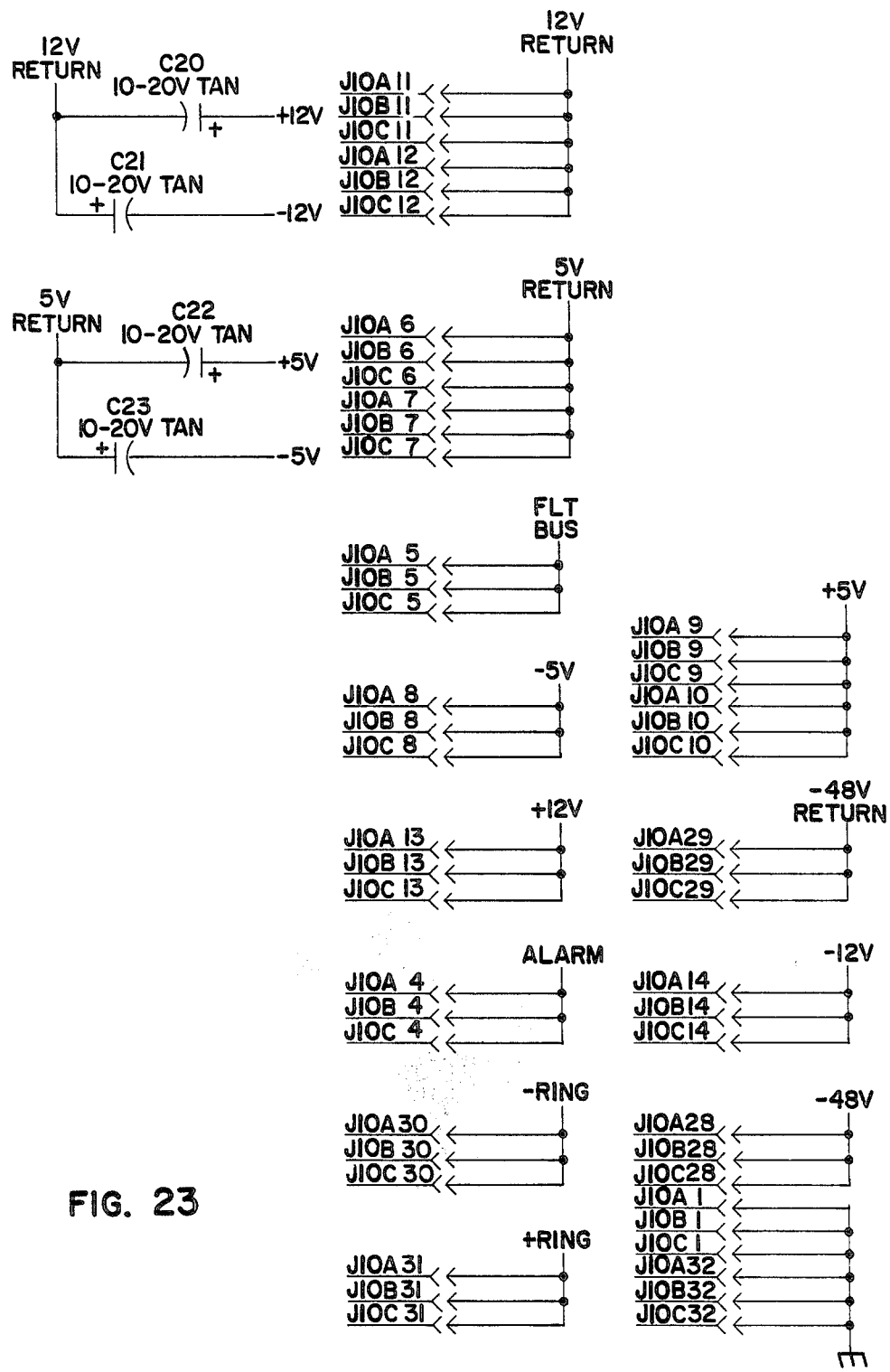
Figure 25:
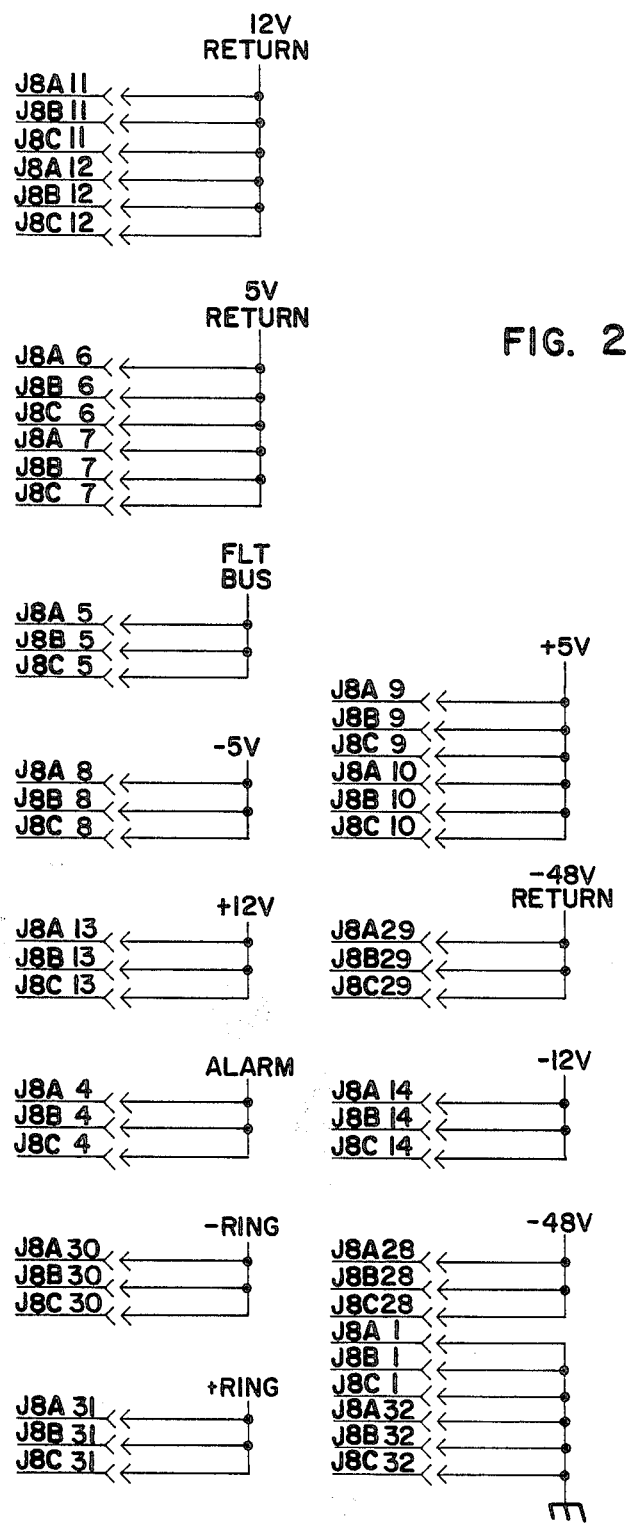
Figure 26:
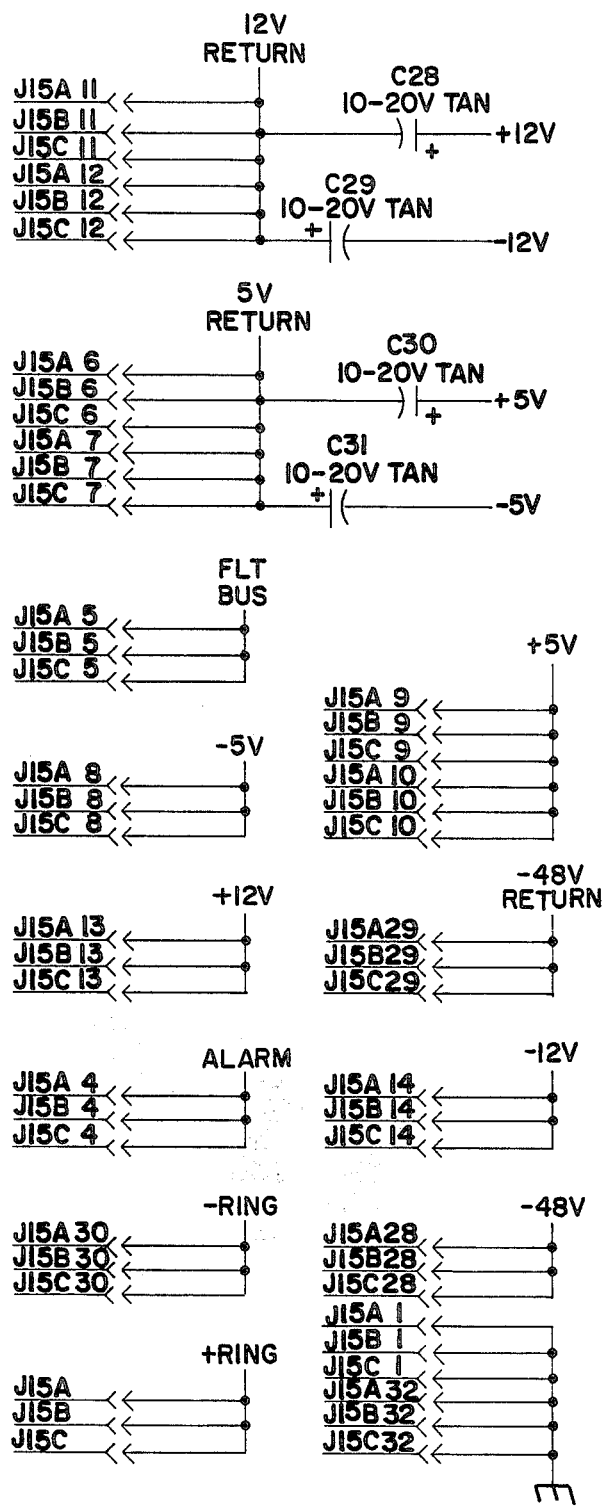
Figure 27:
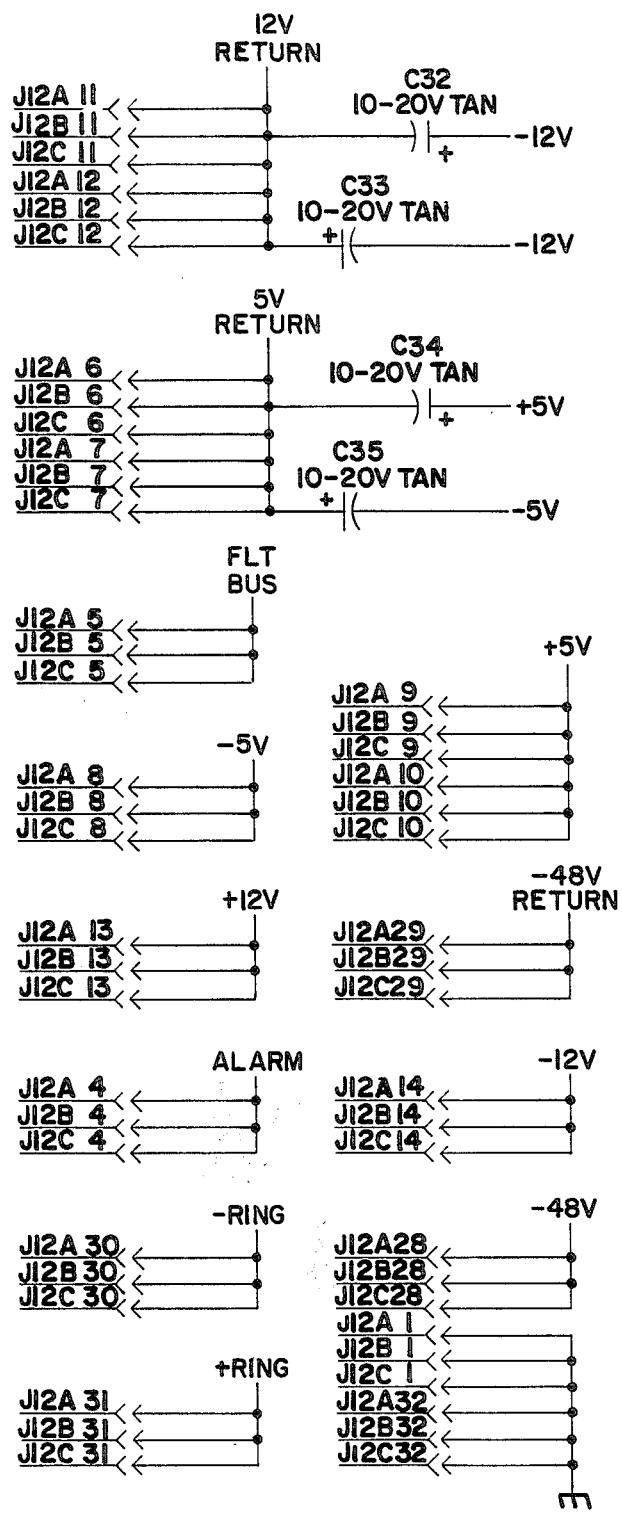
Figure 28:
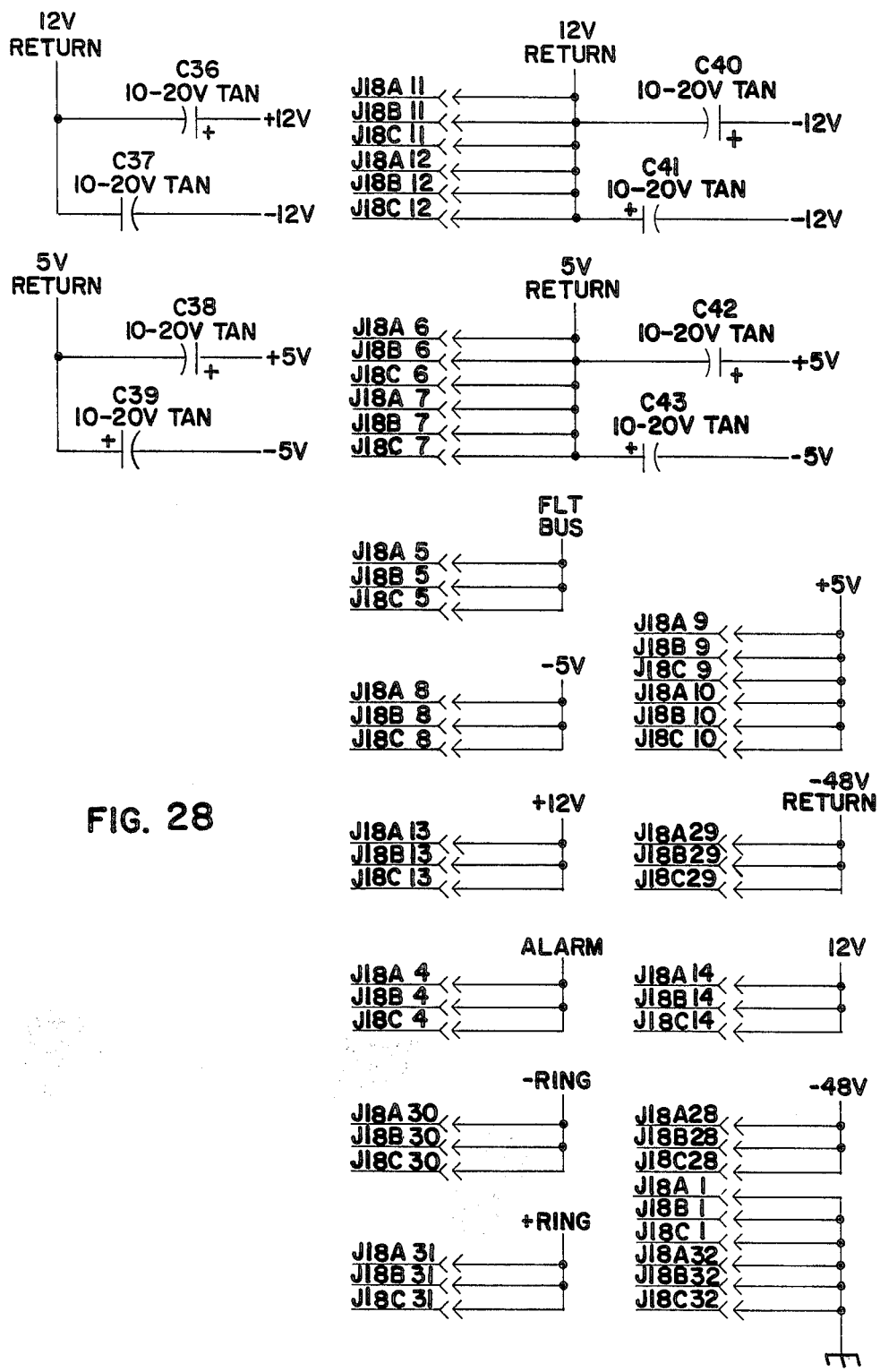

Referring to FIGS. 9 through 16, there is shown the PC layout and assembly of the motherboard 60. FIGS. 9 and 10 taken together show the connector and component layout of the board, with the right end of the portion shown in FIG. 9 being partially repeated in FIG. 10. As shown, the board includes a plurality of connectors 62, which are labelled J1–J10, J12, J15 and J18. Pin 1A of each connector is oriented to appear in the upper left of the connector. In FIG. 11, one of connectors 62 is shown in more detail, having a component side 62a and a circuit side 62b. The printed circuit layouts of FIGS. 12 through 16 are reproductions of the Mylar sheets used in fabricating motherboard 60. As may be appreciated by those skilled in the art, the artwork may be registered with the component layout of FIGS. 9 and 10 in order to determine the exact details of fabrication and assembly of the board.

The electrical schematic for the motherboard 60 is set forth fully in the drawings of FIGS. 17 through 28, which show the preferred connections to the power supply boards and other relevant connections. It should be noted that in FIGS. 17 through 28, the three-pronged ground symbol represents chassis ground, which is preferably connected to signal ground using a factory-installed shorting plug which is located in close proximity of the power supplies. As used in the present invention, the chassis ground must be a non DC-current conducting shield. In other words, the chassis ground is not used to return any DC or digital signals. Rather, it is used only to return current from absorbed RF emission.

Although the motherboard 60 design is set forth fully in all respects, it is most relevant to the present invention with regard to the separate ground lines provided for the different power supply voltages, and for the use of chassis ground plane on the component and solder side of the board which absorbs RF emission. With respect to the supply lines, it has been found that separating the grounds for all different supplies substantially retards the crosstalk and the antenna effect that is otherwise present when signal noise is spread over the circuitry on common ground busses.

The rear connectors J1–J10 are provided to mate with either data conversion modules or with test modules, and thus have rear tails. The power supply connectors, however, J12, J15 and J18, are preferably female on the rear side since no external connections are required.

Figure 29:
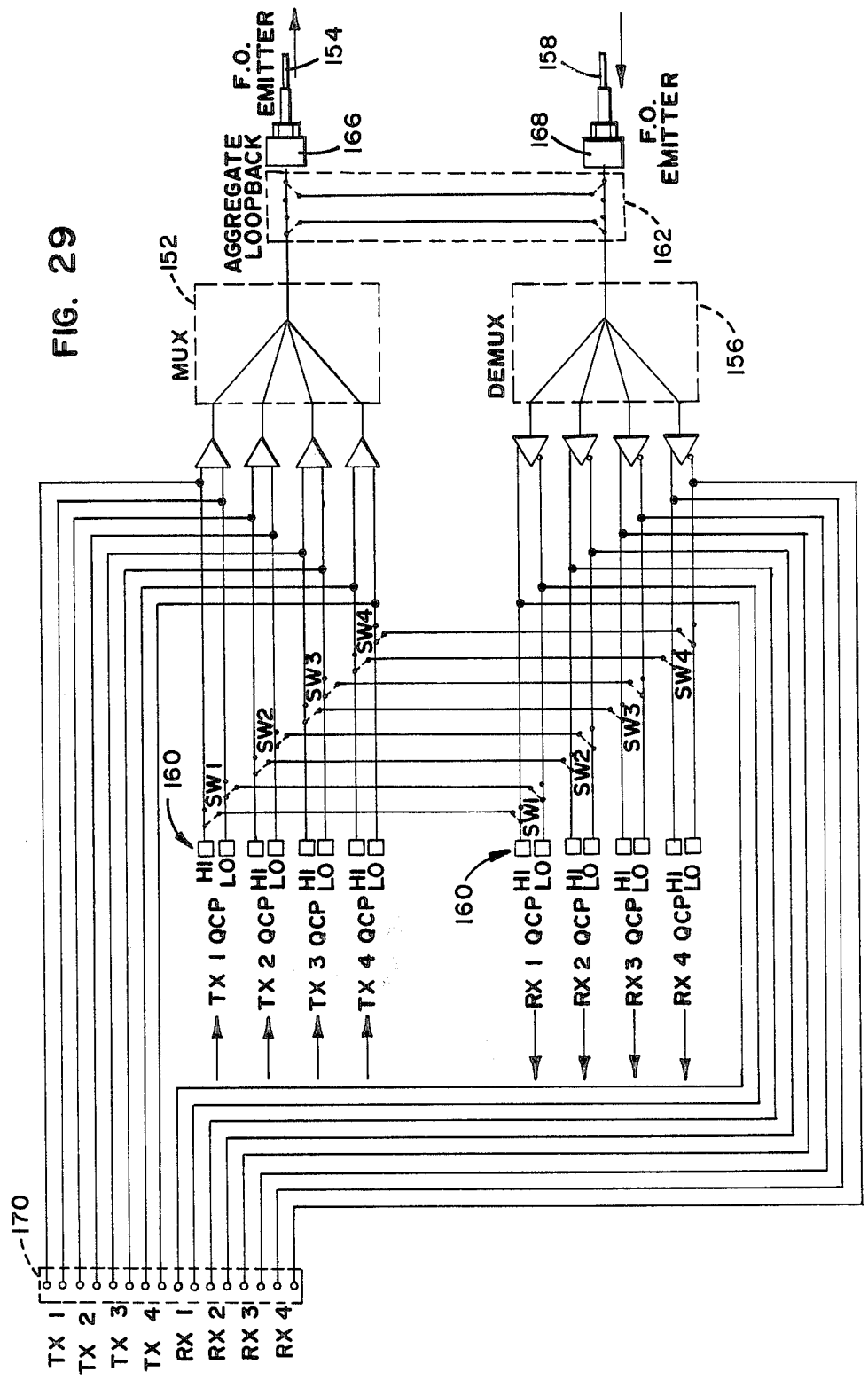
FIG. 29 is an electrical schematic diagram of the low speed channel multiplexer according to the present invention.
Figure 31:
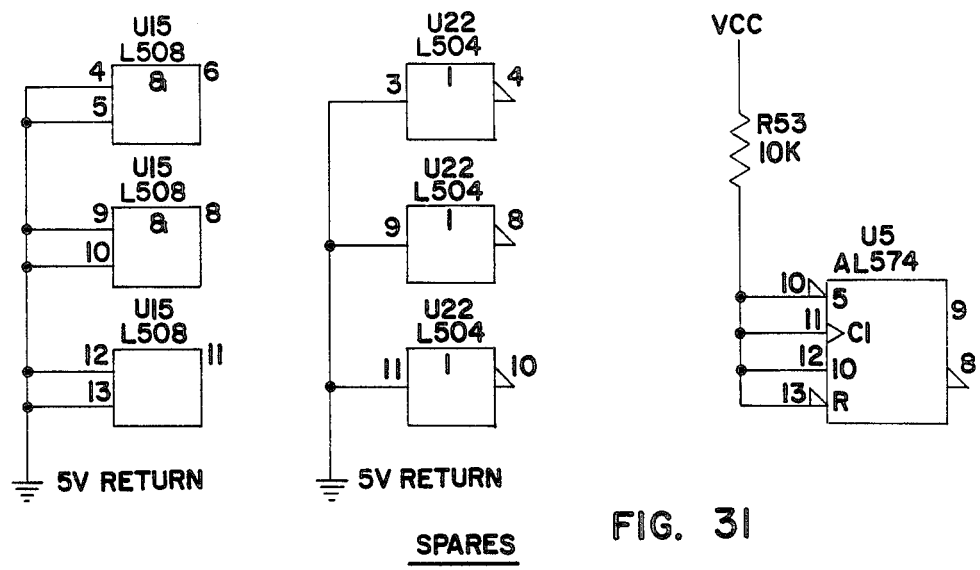
Figure 32:
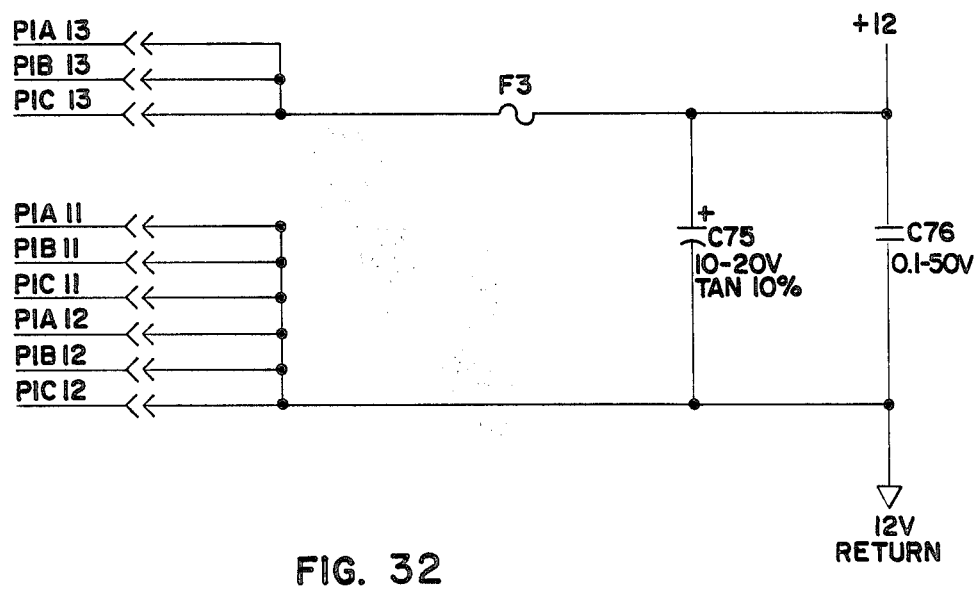
Figure 33:
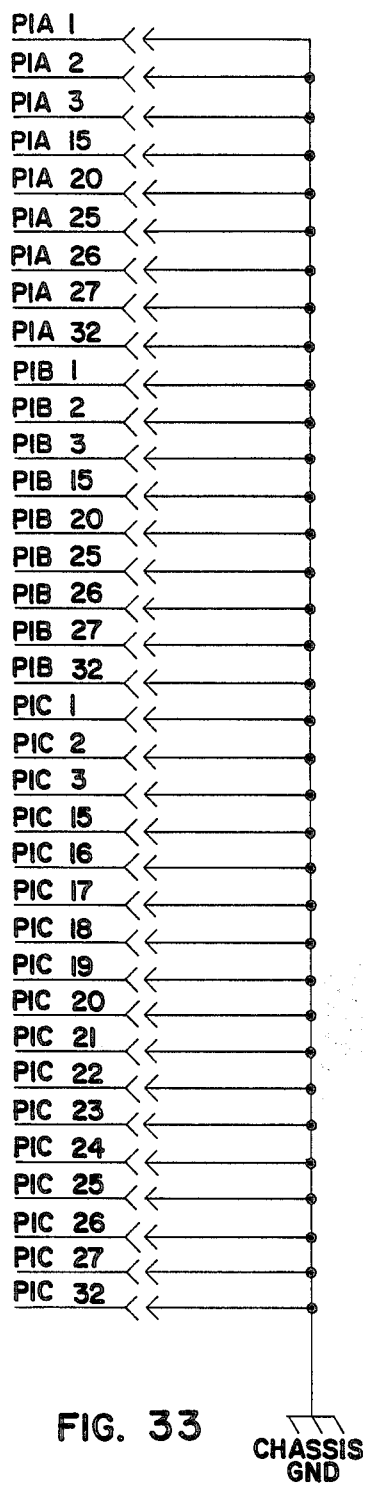
Figure 34:
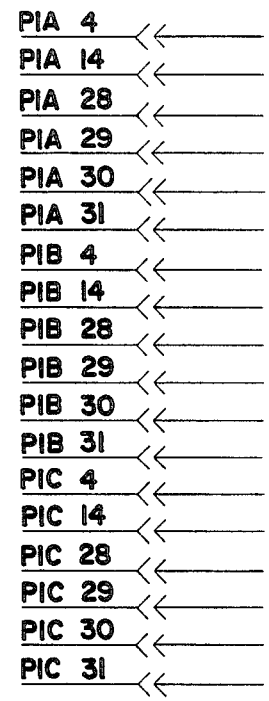
Figure 35:
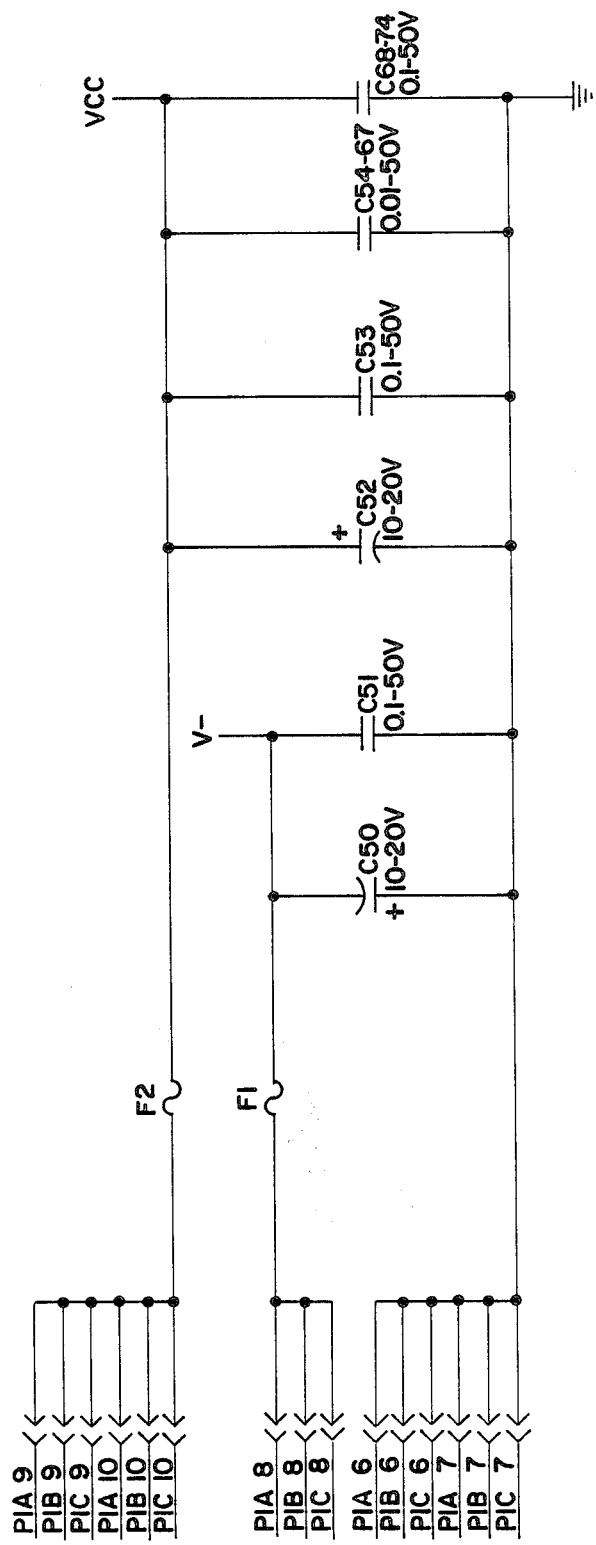
Figure 36A:
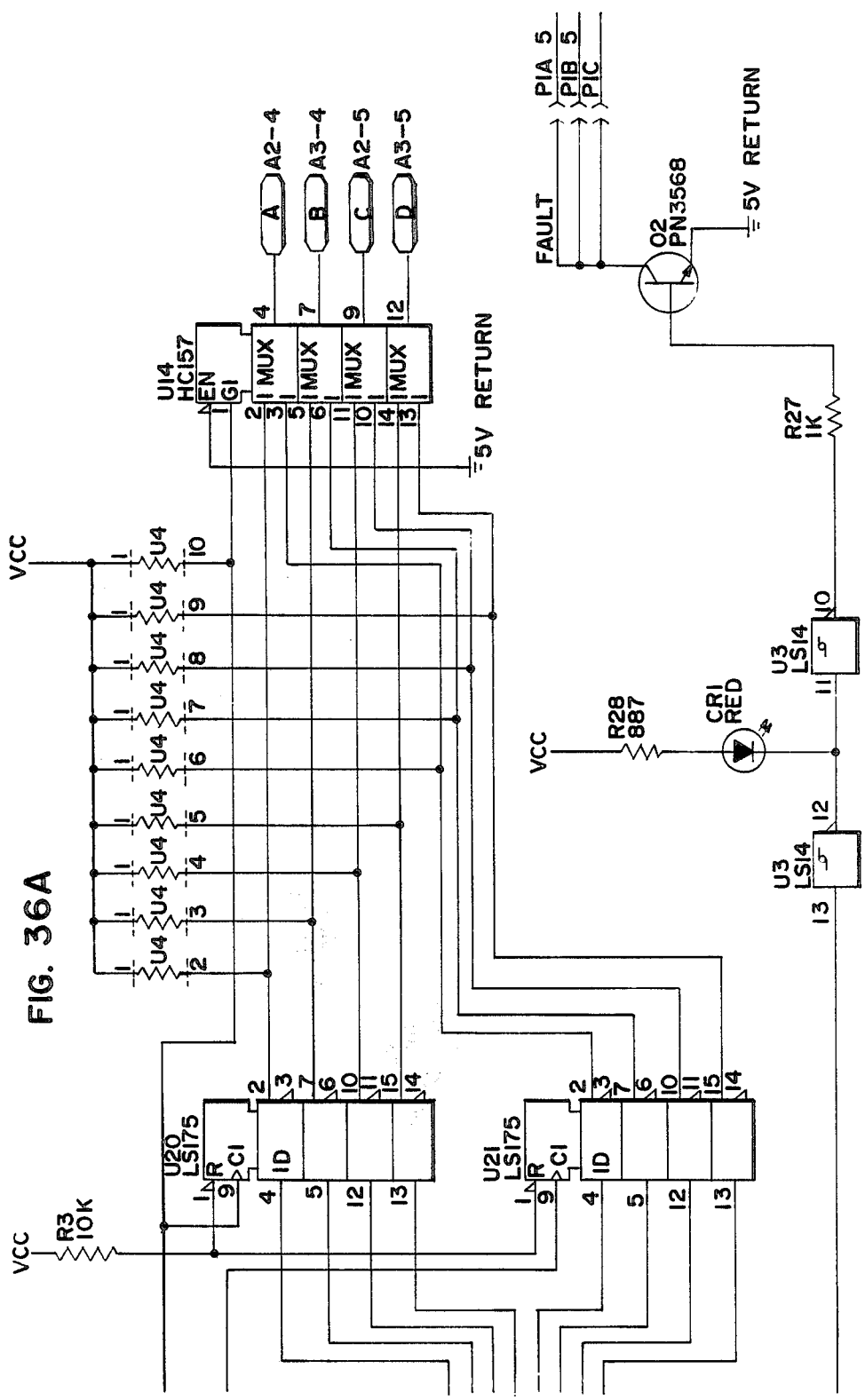
Figure 36B:
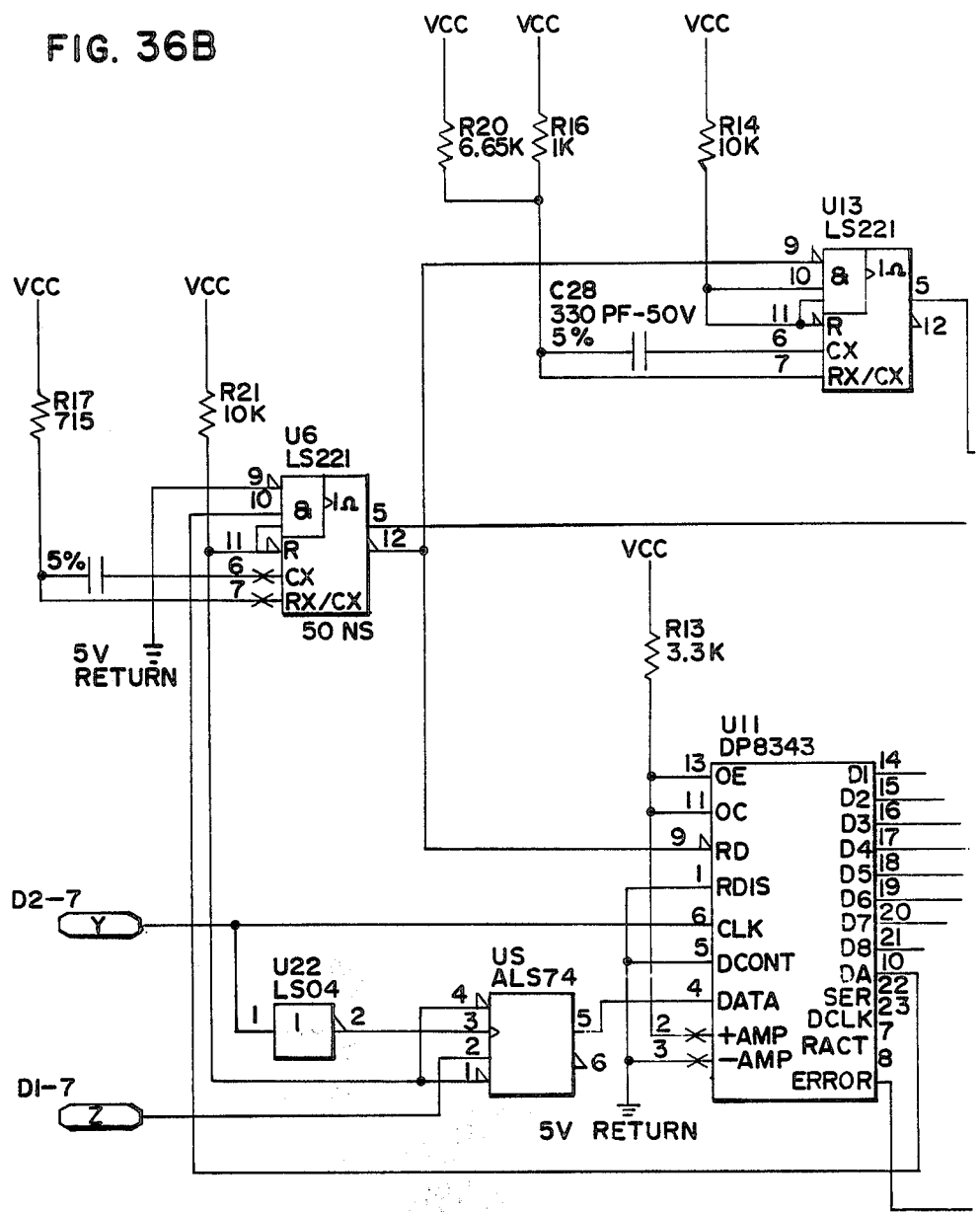
Figure 37A:
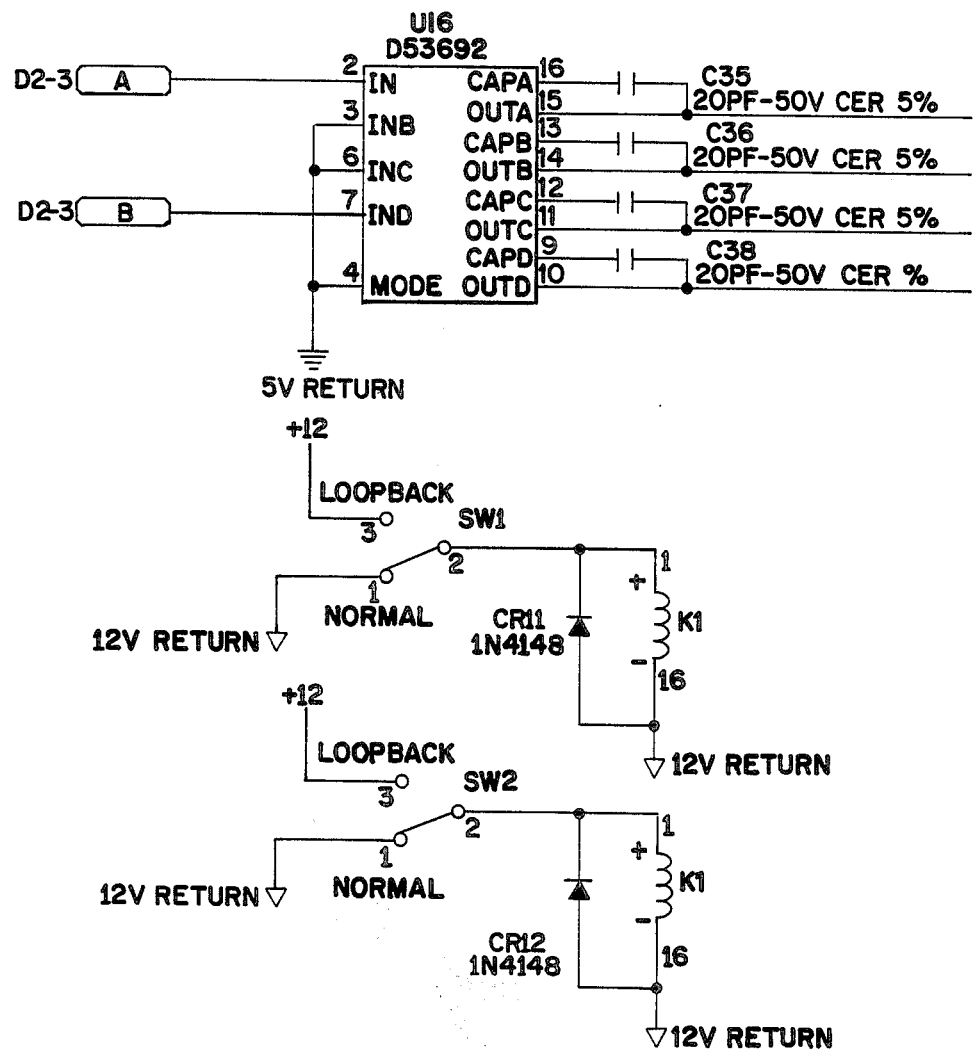
Figure 37B:
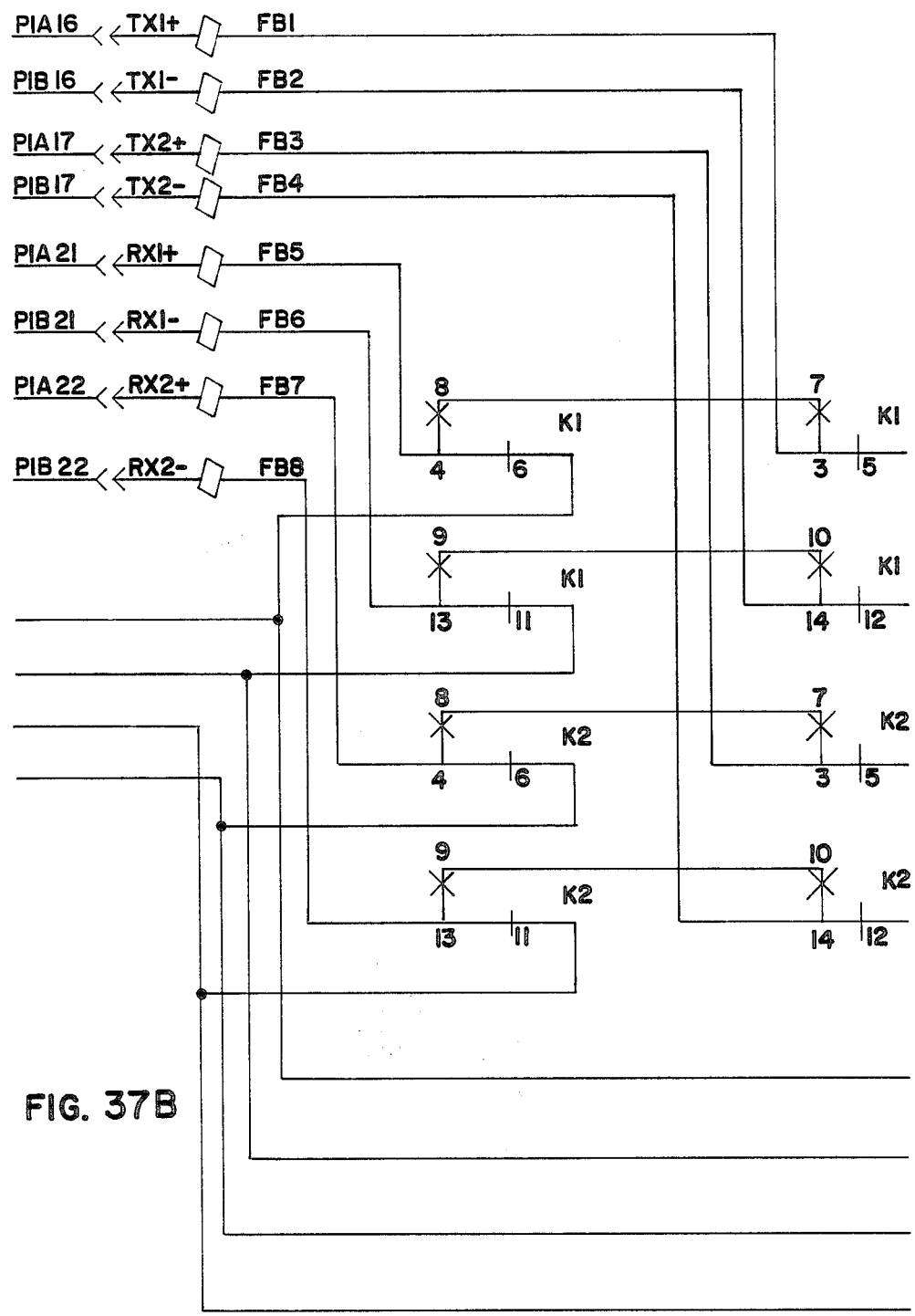
Figure 37C:
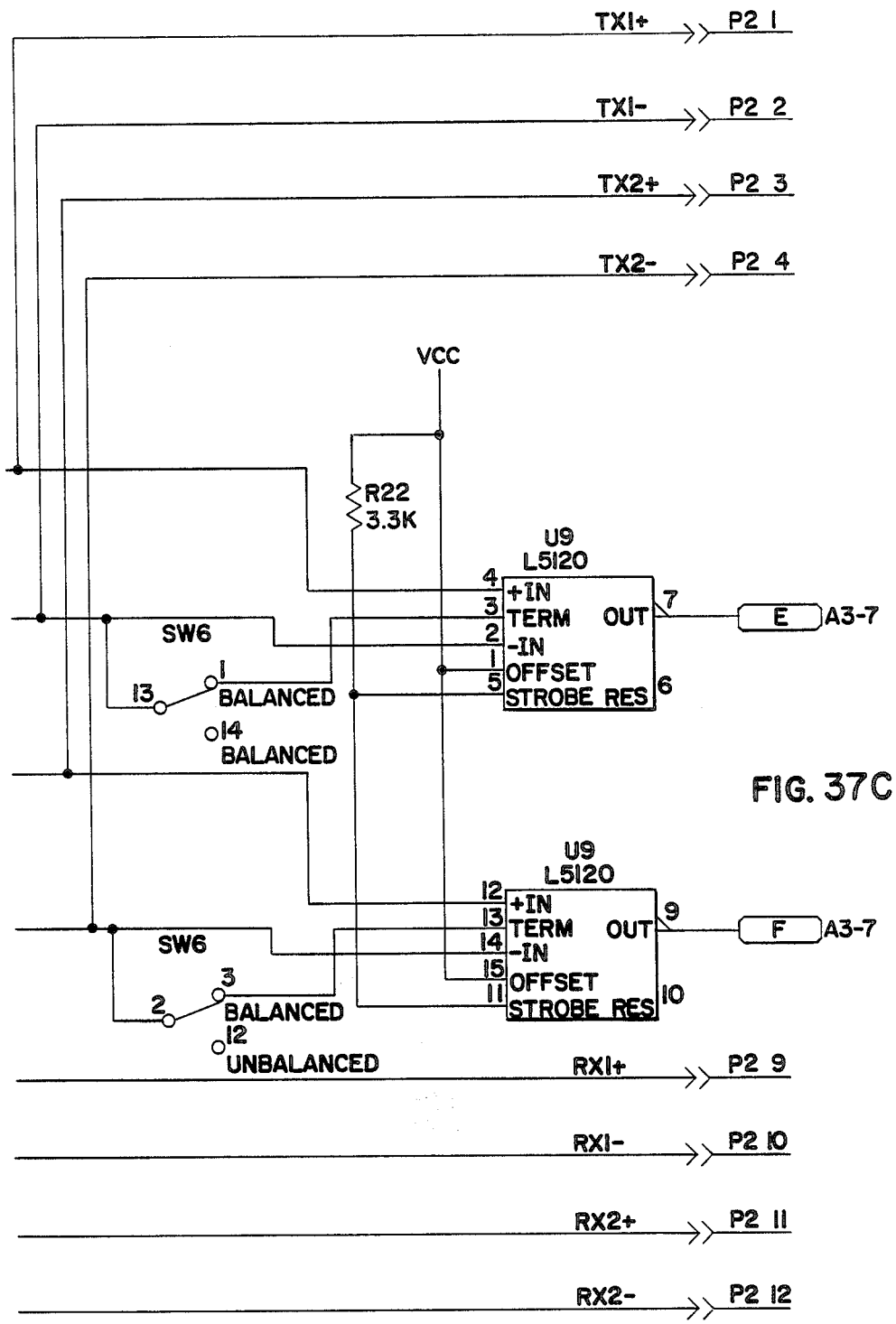
Figure 38A:
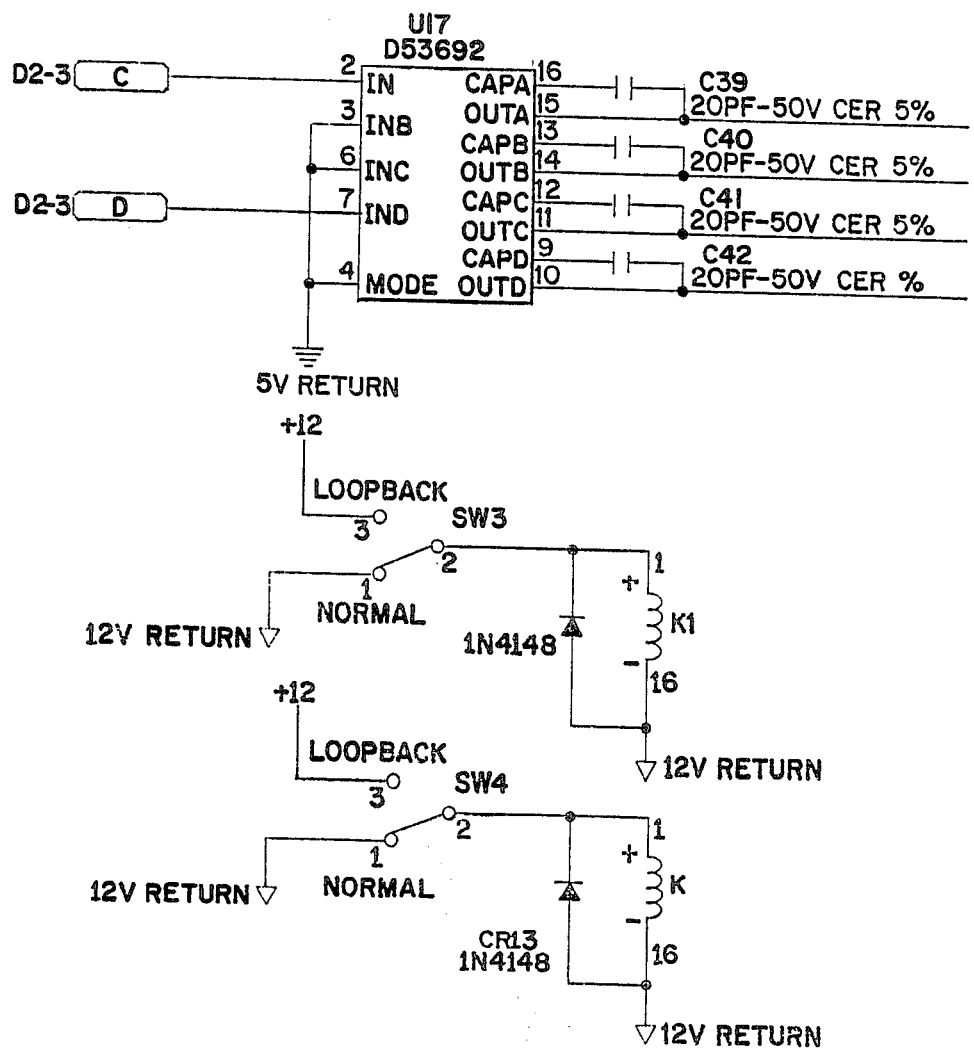
Figure 38B:
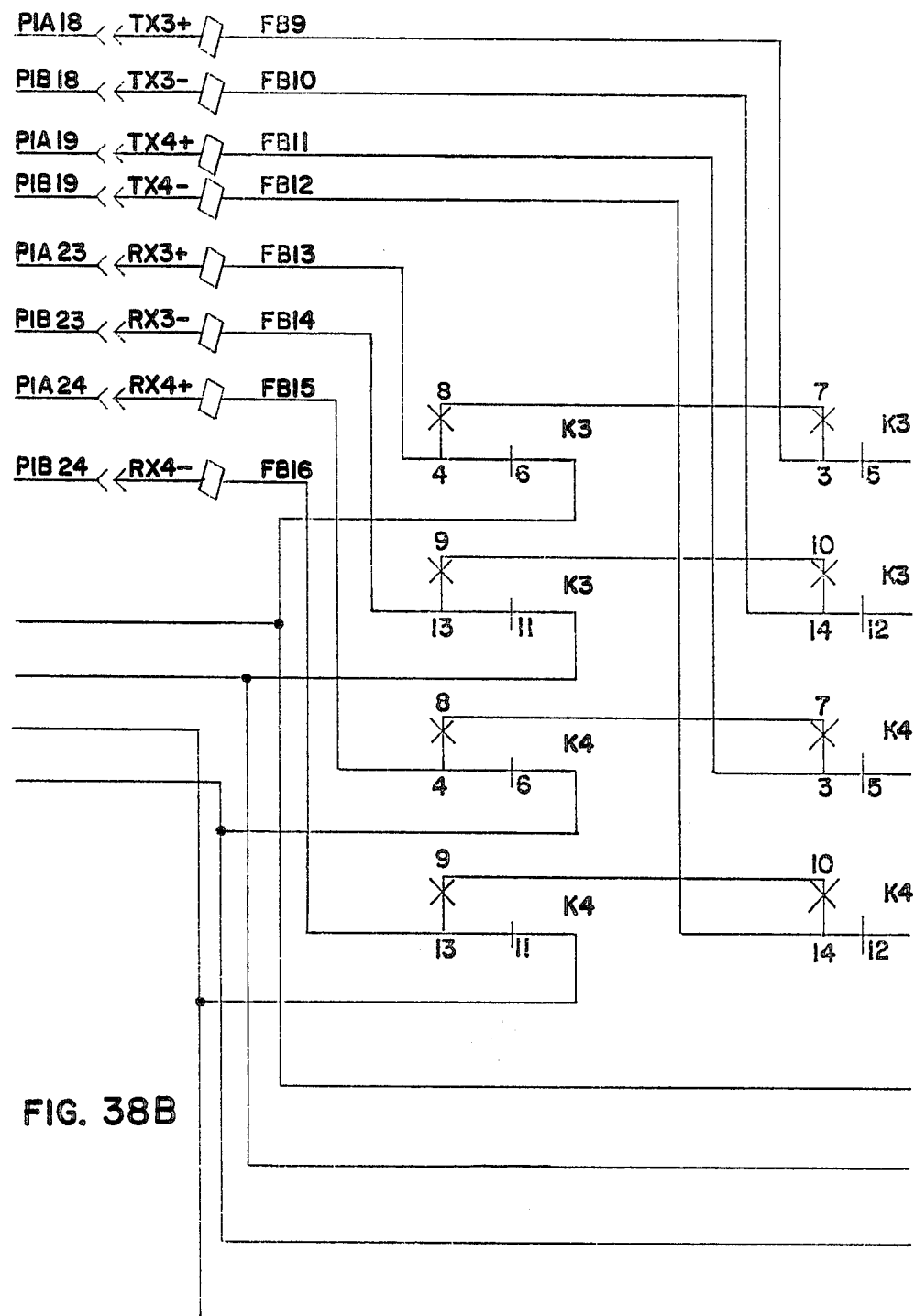
Figure 38C:
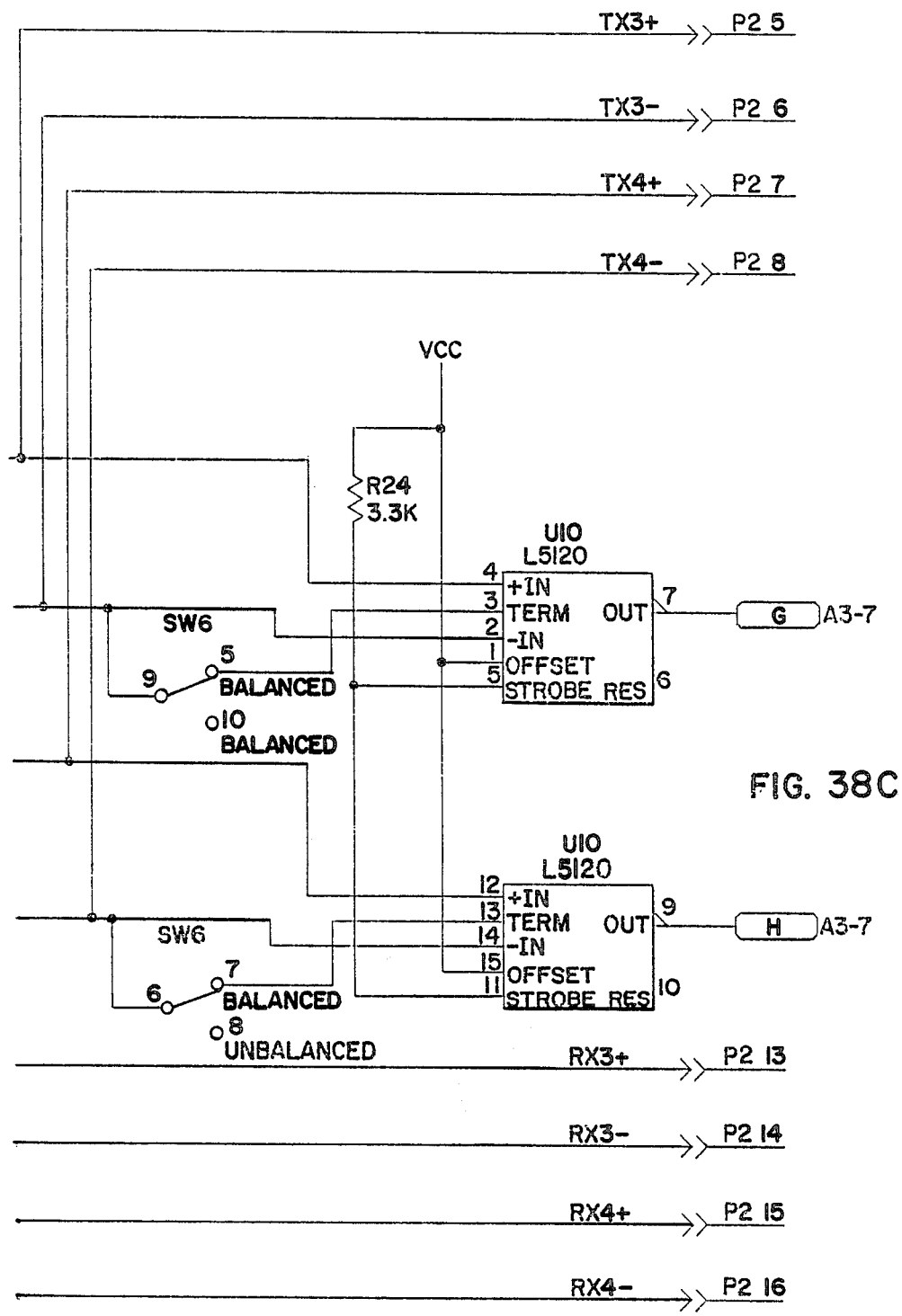
Figure 39A:
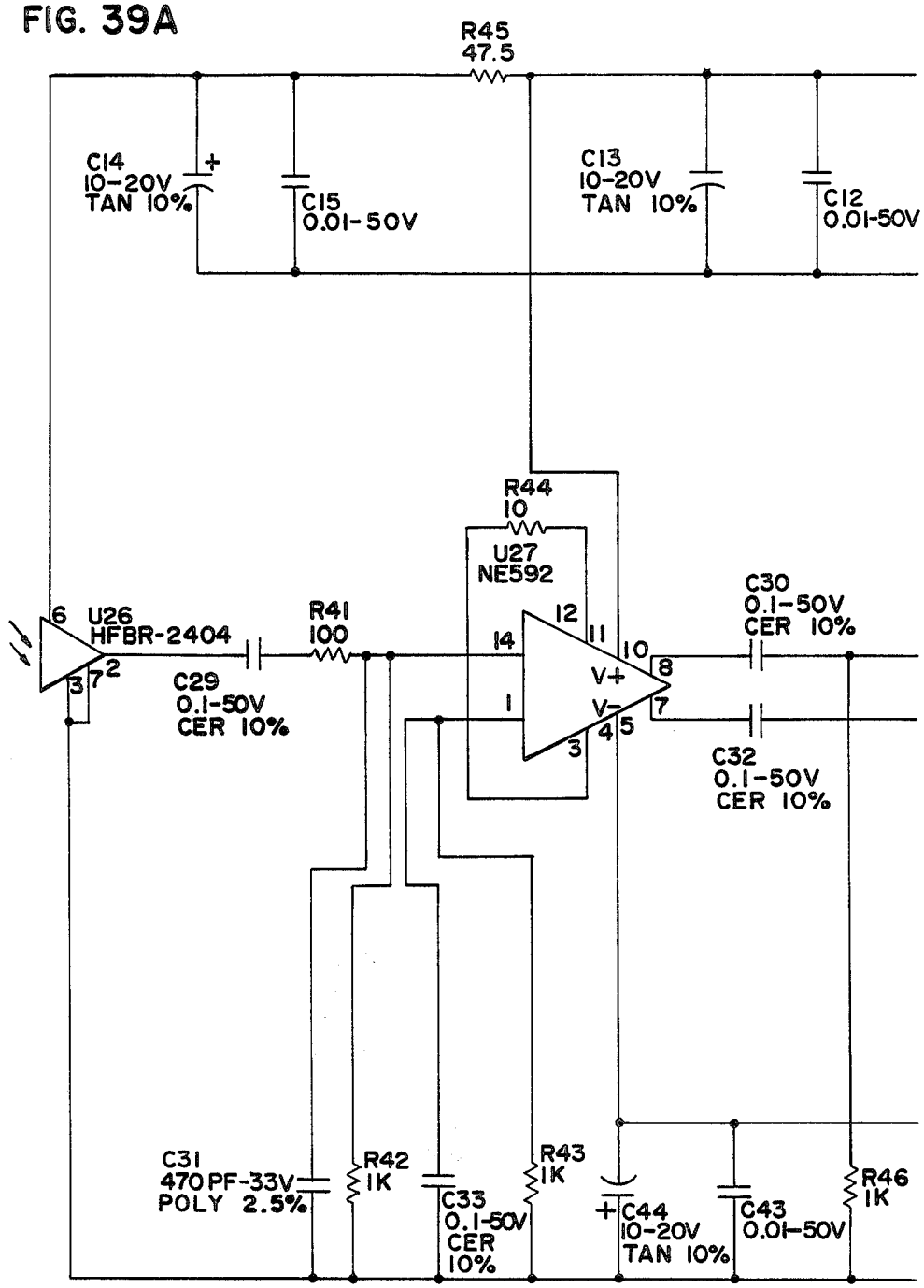
Figure 39B:
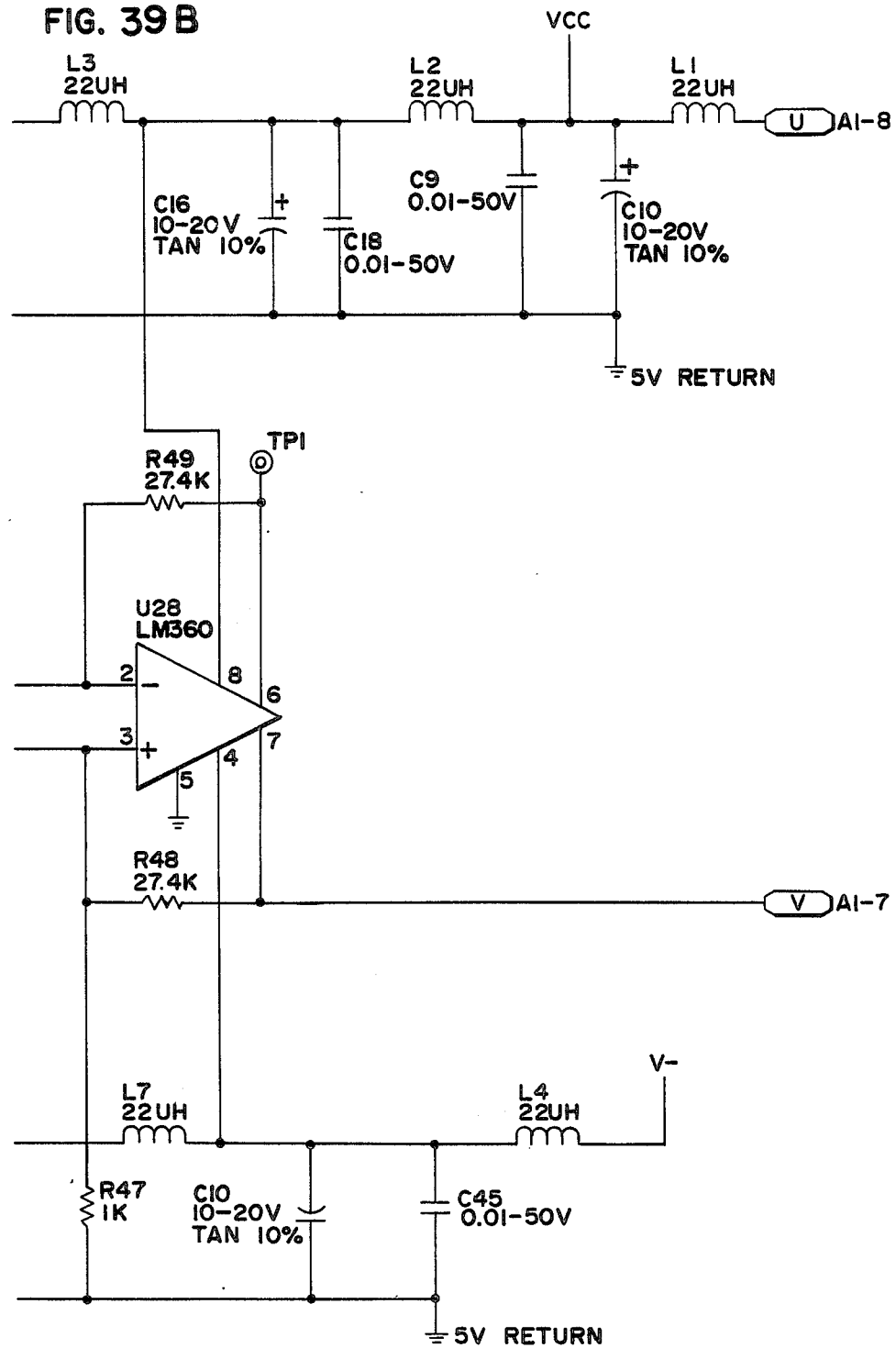
Figure 40A:
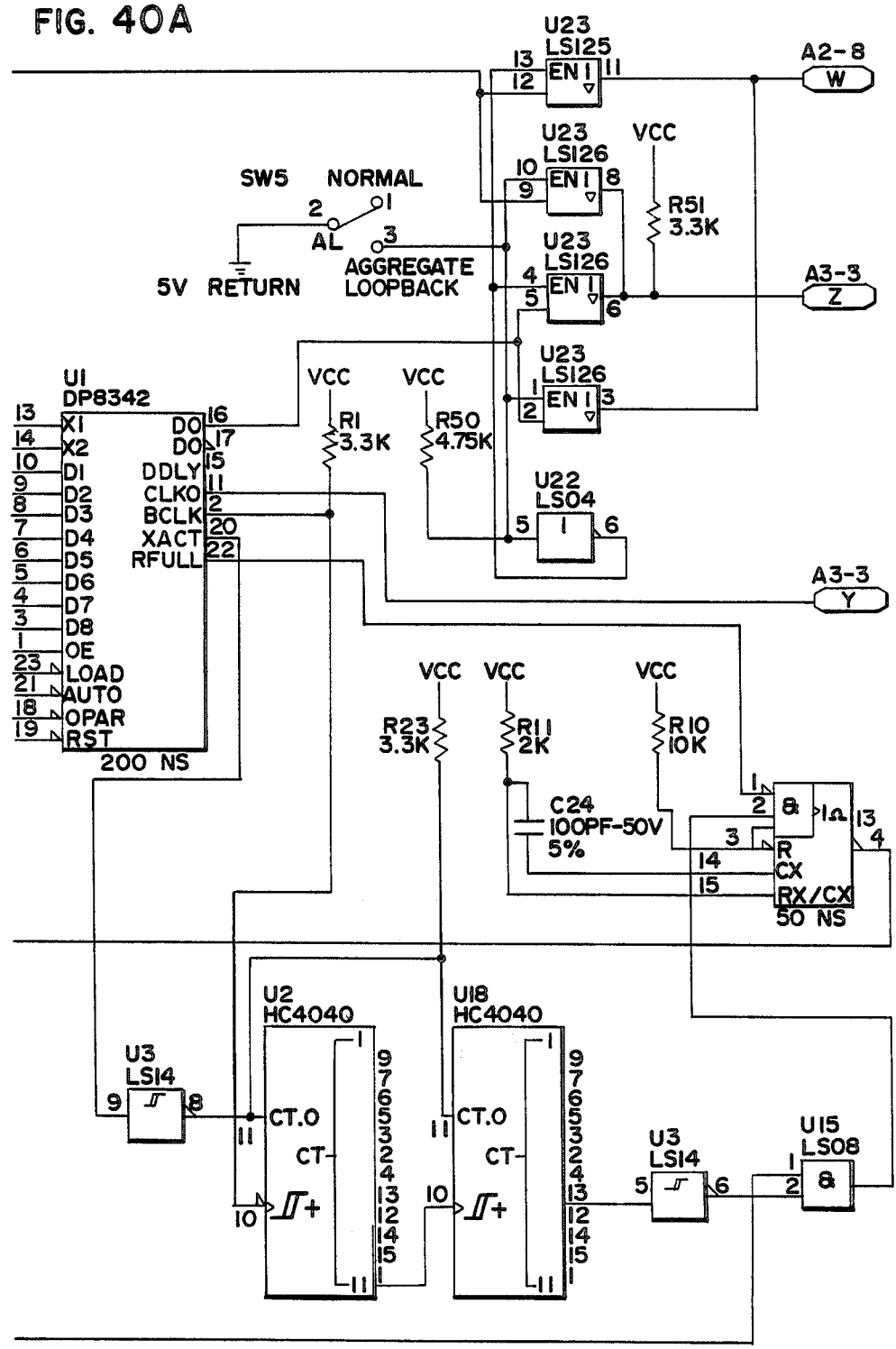
Figure 40B:
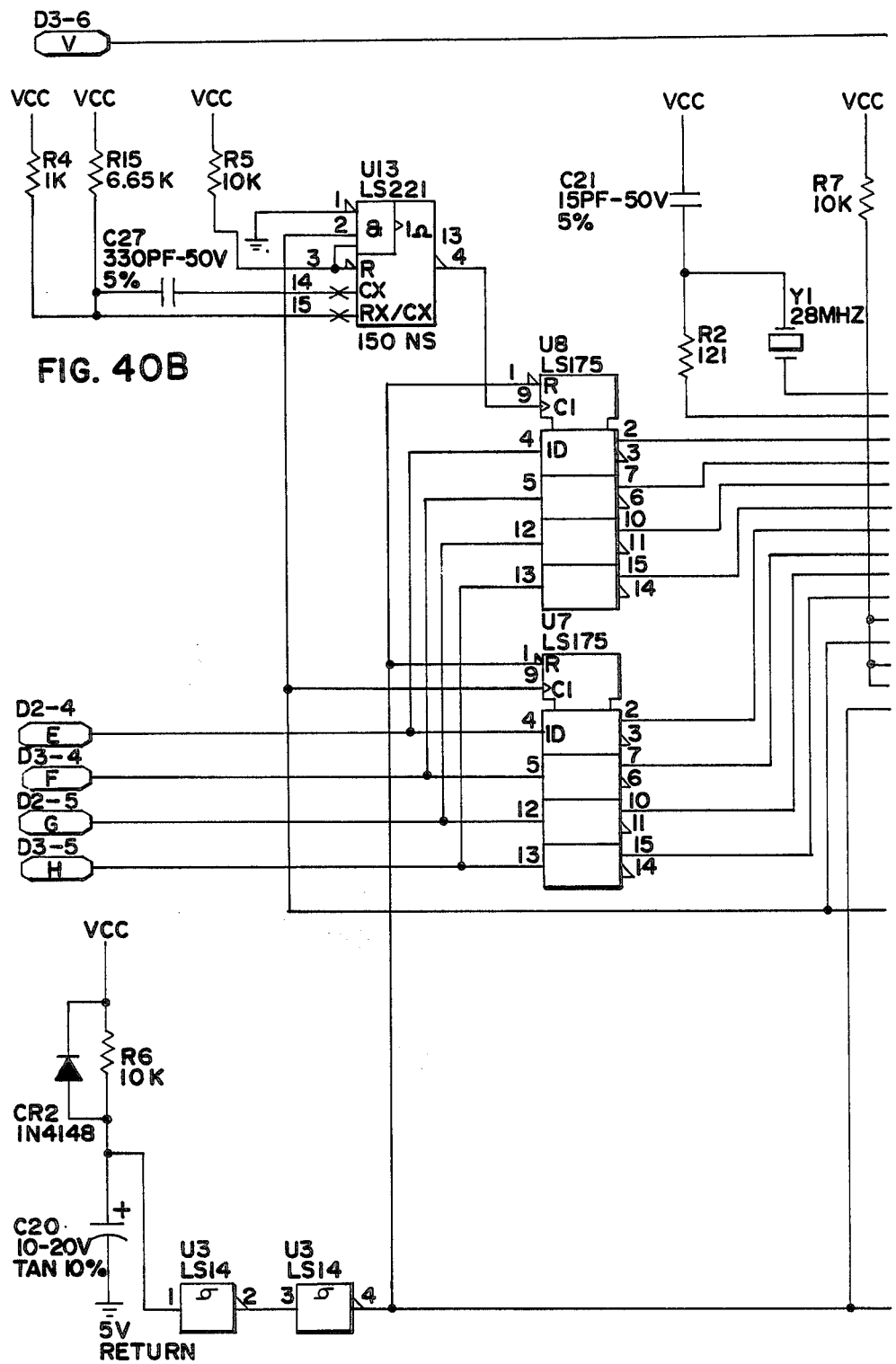
Figure 41A:
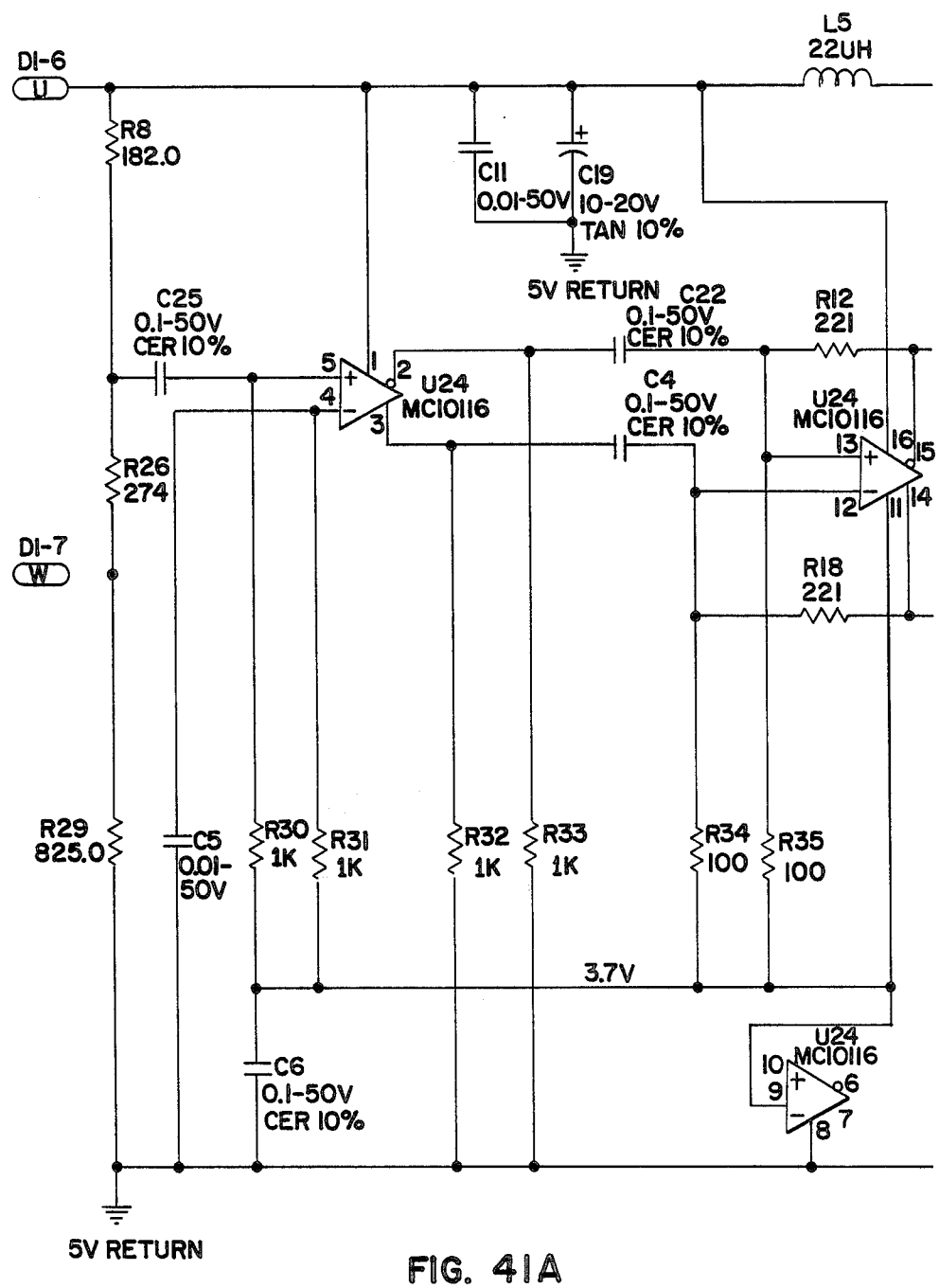
Figure 41B:
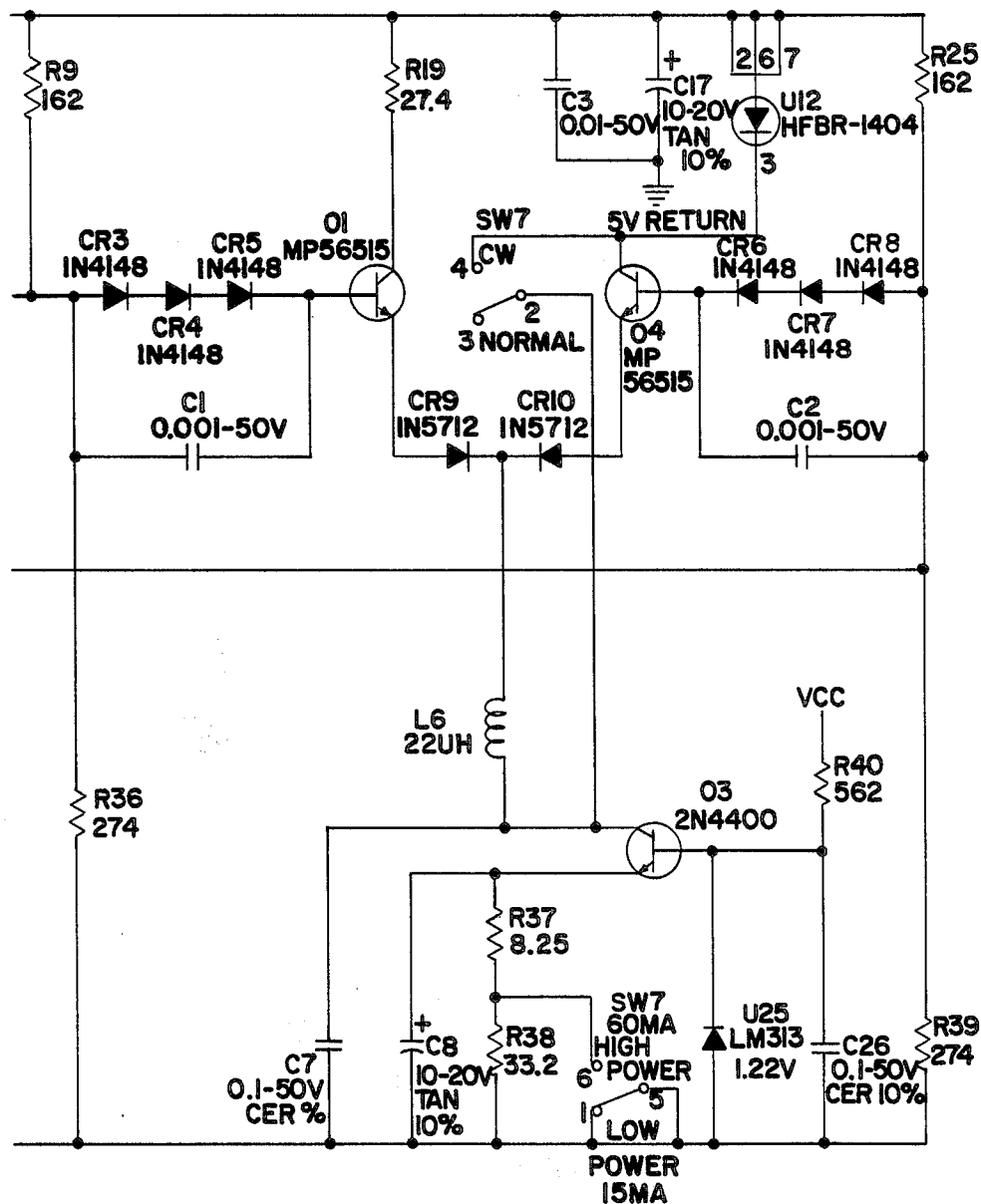

One of the low speed multiplexer circuit modules 100 for converting electrical channels to optic channels, will now be described in detail. Referring first to FIG. 29 there is shown a schematic electrical diagram of the basic circuitry of the multiplexer module 100. Circuitry 150 includes a multiplexer 152 for multiplexing and encoding a plurality of transmit (TX) channels onto a single fiber optic fiber 154. Similarly, a demultiplexer 156 is provided to decode and demultiplex a plurality of receive (RX) data channels carried on fiber 158. Preferably, a quick connect panel including a plurality of quick connect connectors (QCP) 160 are provided at the rear of the chassis 12, as was mentioned above. One pair of these connectors is thus used to terminate one transmit or receive pair for a RS 232 type data channel. These connectors are connected through the corresponding motherboard connector 62 to the corresponding one of either multiplexer 152 or demultiplexer 154, as illustrated.

Circuitry 150 further includes five loop back options, one individual loopback for each transmit and receive pair, shown as SW1–SW4 and one aggregate loop back option 162, which provides that both the fiber optic converters 166 and 168 are looped together as well as multiplexer 152 and demultiplexer 154. As is illustrated with respect to FIG. 2, and as will be later illustrated, the five loop back switches are all accessible from the front panel of the module 100. In addition to front panel access to the loop back switches, the module 100 further provides a front panel accessible connector port 170, which as illustrated provides access to each transmit and receive pair handled by the module.

Referring now to FIGS. 30 through 41 there is illustrated in detail the electrical schematic for one of modules 100. Because the schematics are self-explanatory upon inspection they will only be briefly described herein. First, those figures which are broken down with alpha designations, for instance 36A and 36B, include interconnections from the schematic of one drawing to the next. These interconnections are not labeled but may be readily correlated by aligning the sheets side-by-side. Furthermore, references throughout the figures to "U" designations relate to integrated circuit elements, while "C" refers to capacitors, "R" to resistors and "L" to inductors. Connectors are designated with the prefix "P", with "P1" referencing the in-line connector on the rear of module 100 and "P2" referring to the front panel port connector 170. Finally, the alpha labeled connector tags A through Z designate interconnection points as between figures of different numbers, for instance between 36A and 39B.

Figure 42B:
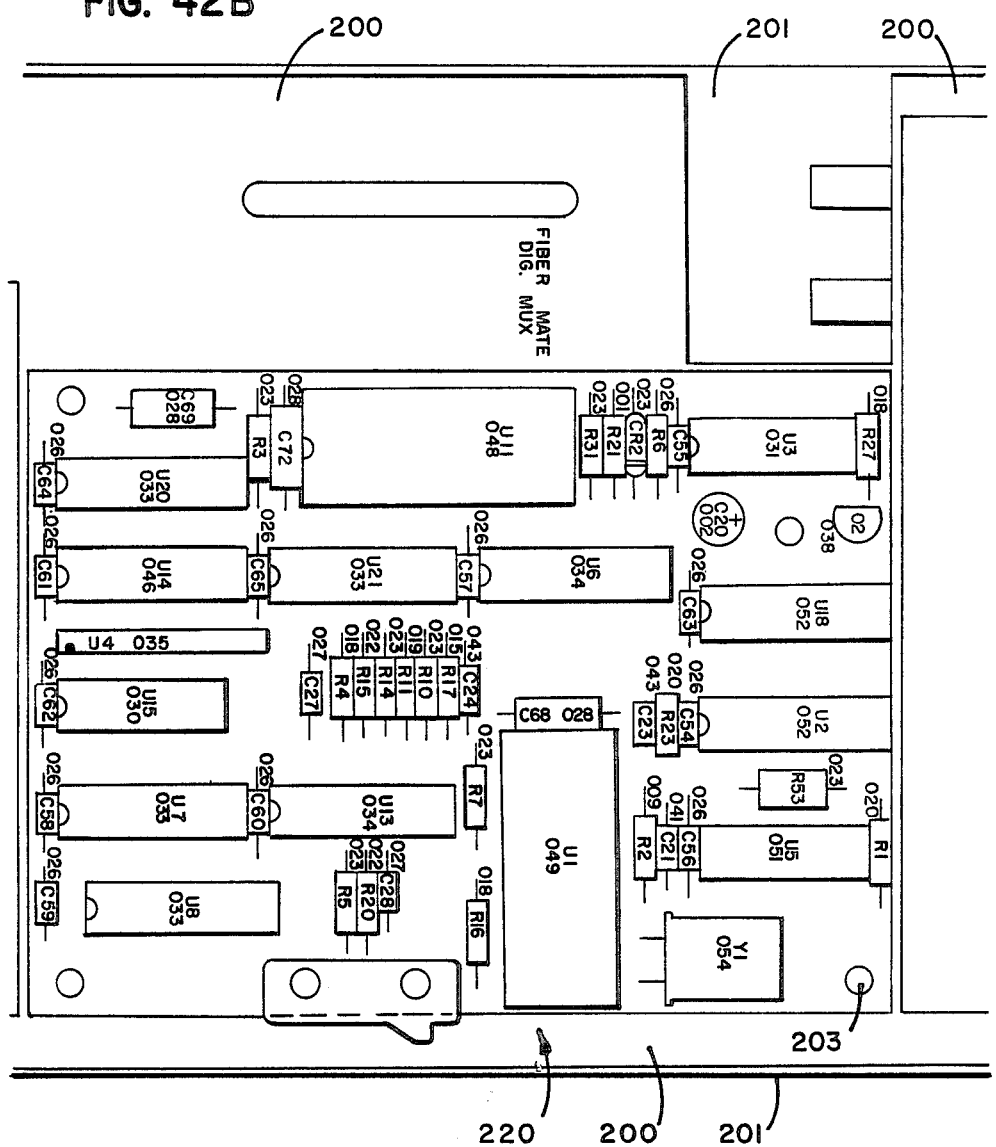
Figure 42C:
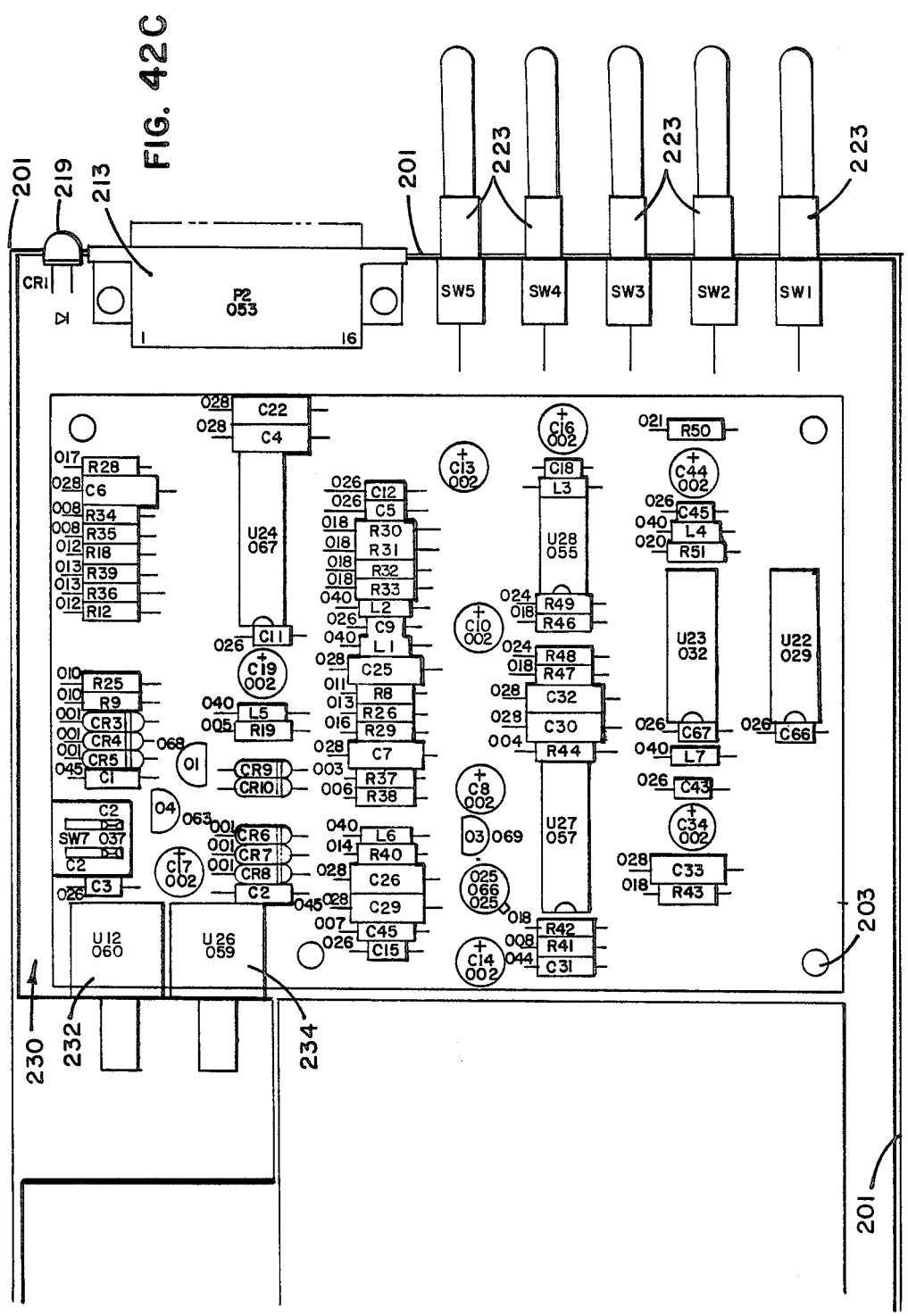

Referring now to FIGS. 42A, 42B, 42C and 42D (the front panel) which when laid side-by-side show the assembly and component layout on a module 100, the general nature of the corresponding circuits of FIGS. 30 through 41 will be given. The circuits of module 100 are physically and electrically divided into three areas. A first area 210 is located toward the rear of the circuit board 200, as shown in FIG. 42A, and provides for interfacing with the electrical channels, including the functions of converting between five volt logic and the higher voltage RS 232 type logic levels. The RS 232 interface section is adjacent the multiplexing/demultiplexing circuit area 220, which is located in the middle of the board, as shown in FIG. 42B. This area of the circuit functions to multiplex and demuliplex the RS 232 channels, and consequently exhibiting relatively high frequency operation, which is most problematic in terms of RF radiation. A final area of the board is shown in FIG. 42C, namely the fiber optic driver/receiver and loop back circuit section 230. Accordingly, section 230 is located adjacent the loop back switches SW1–SW5. As illustrated, the fiber optic coupling units 232 and 234 are located sufficiently forward in the card to allow that a technician inserting or extracting a module may connect and disconnect fibers to the units 232 and 234 while the module is supported in the chassis slots.

Accordingly, by correlating the position of the components on the board 200 as described above with the corresponding components shown in the detailed electrical schematics, the nature and function of the various circuit schematic elements should become apparent.

Figure 43:
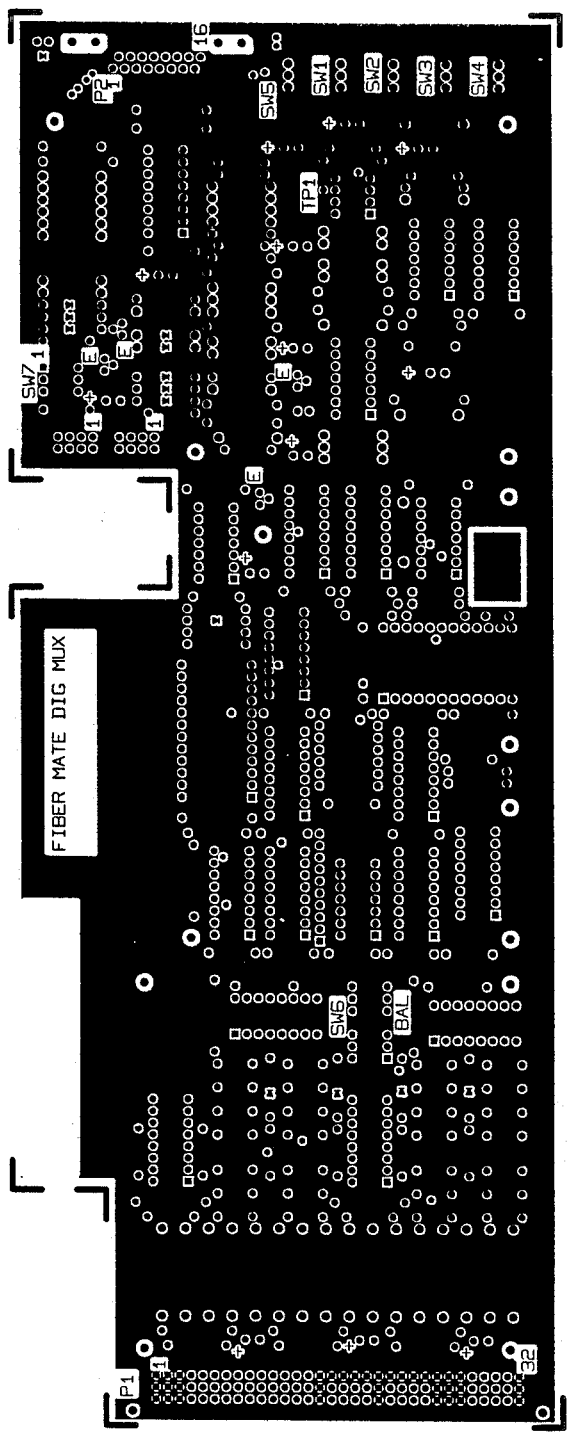
FIGS. 43-49 show the Mylar sheets for the various labels of the circuit board of the multiplexer module according to the present invention.
Figure 44:
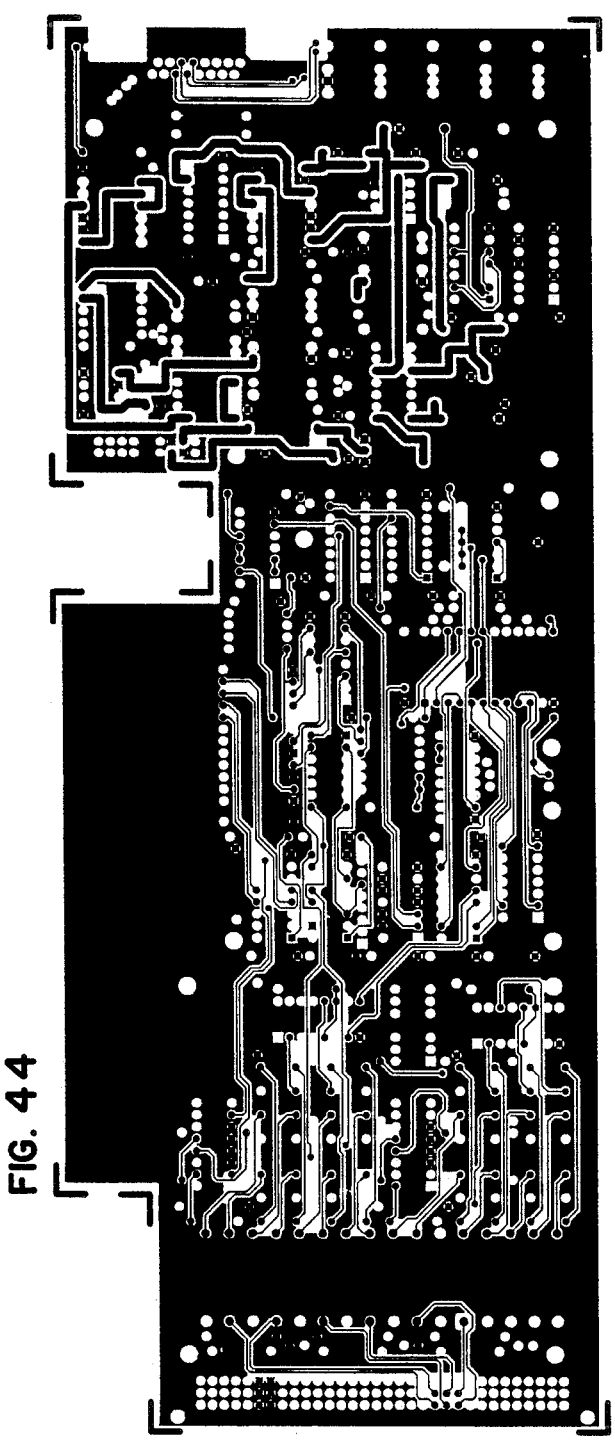
Figure 49:
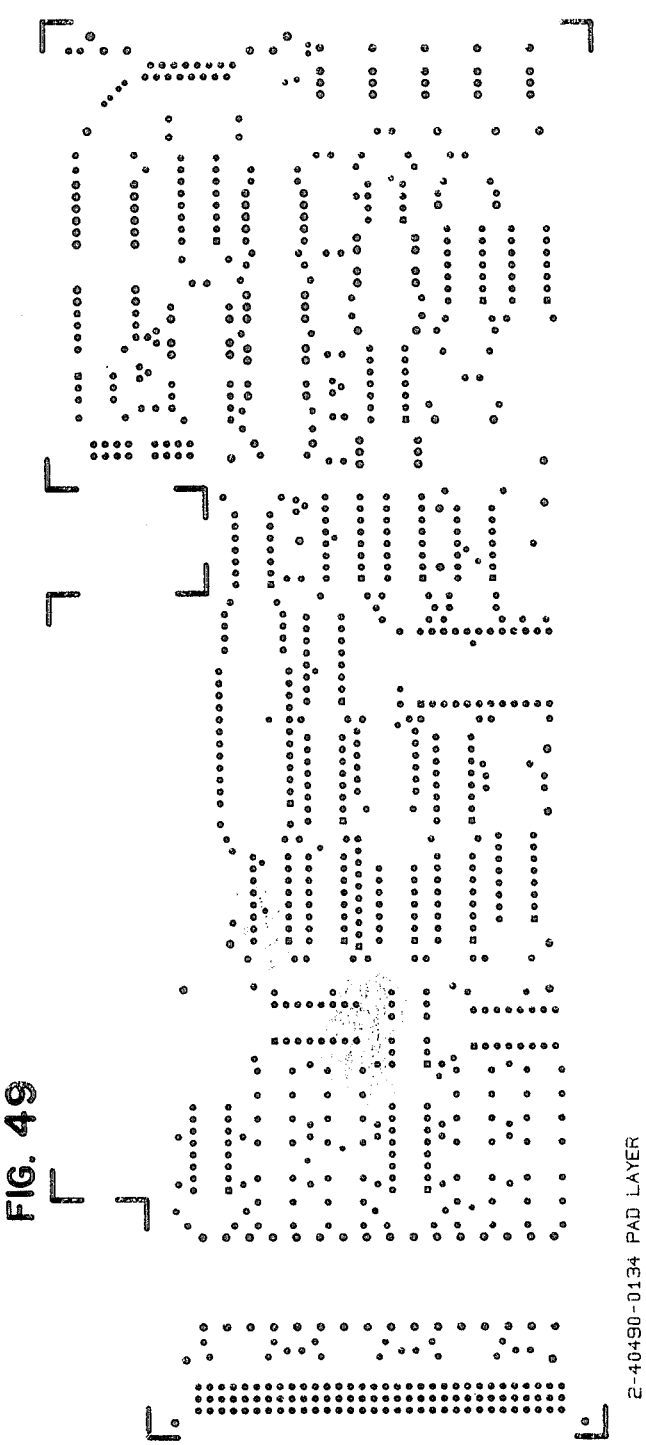

Referring now to FIGS. 43 through 49 the circuit board artwork and printed circuit layout will be described. Circuit board 200 is a six layer printed circuit board which is specially designed to suppress RF radiation from the module. Each layer of the board is represented by one of FIGS. 43 through 48, with FIG. 49 representing the pad artwork for the layer of FIG. 43. FIG. 43 represents the first layer of the board on the component side. As shown, this layer is substantially covered with a ground plane which is connected to the chassis ground, a non-current conducting ground. FIG. 44 represents the second layer of the board 200 and provides for interconnection of components. This second "signal" layer also includes a substantial plating of ground plane, in this case the signal ground for the five volt supply.

Figure 45:
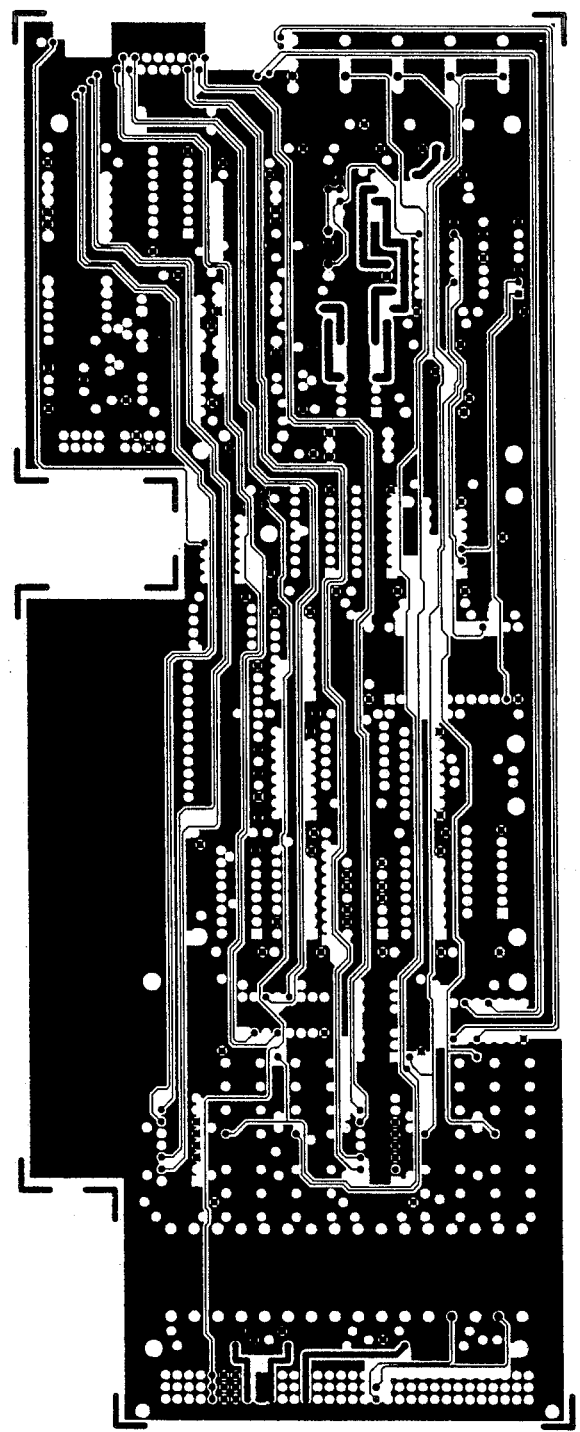
Figure 46:
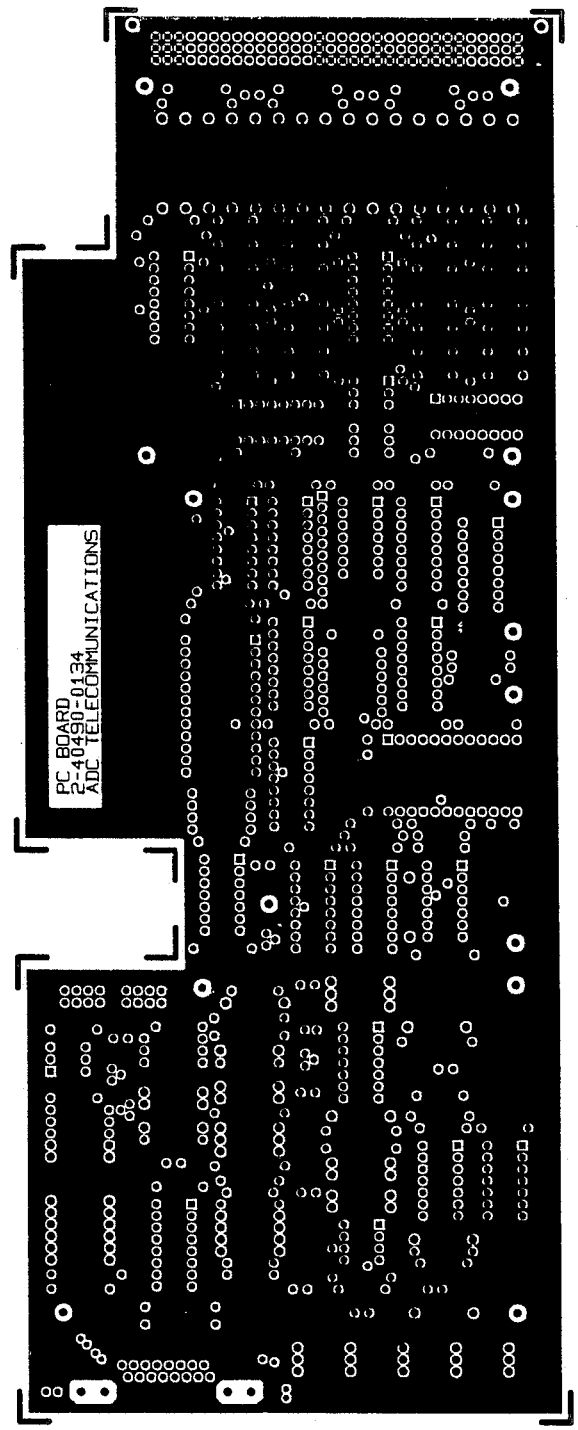

The third layer, shown in FIG. 45 is dedicated to connecting the front panel port connector to the RS 232 channels entering the board at the rear thereof. Accordingly, this layer is known as the "interconnect layer". The present invention buries this layer internally to the board in order to minimize the antenna effect inherent in long printed circuit runs. Furthermore, the interconnect layer is also liberally plated with signal ground plane. The fourth layer of the board is shown in FIG. 46 and consists of power distribution runs and is also liberally plated with signal ground.

Figure 47:
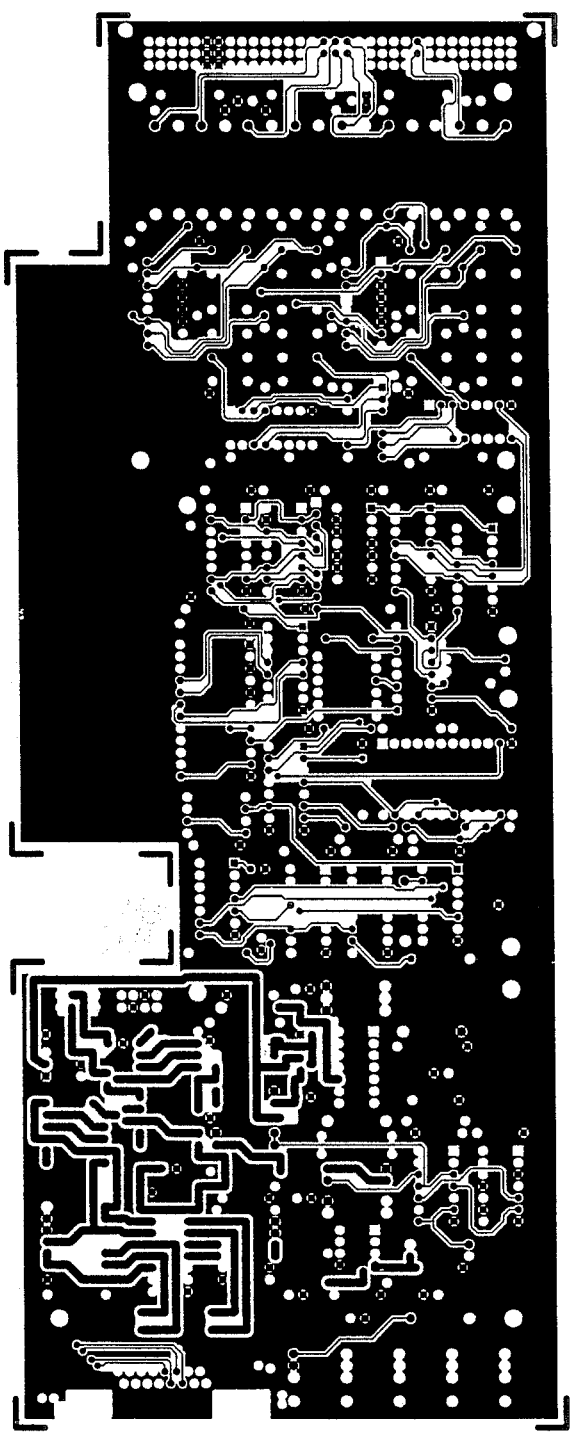
Figure 48:
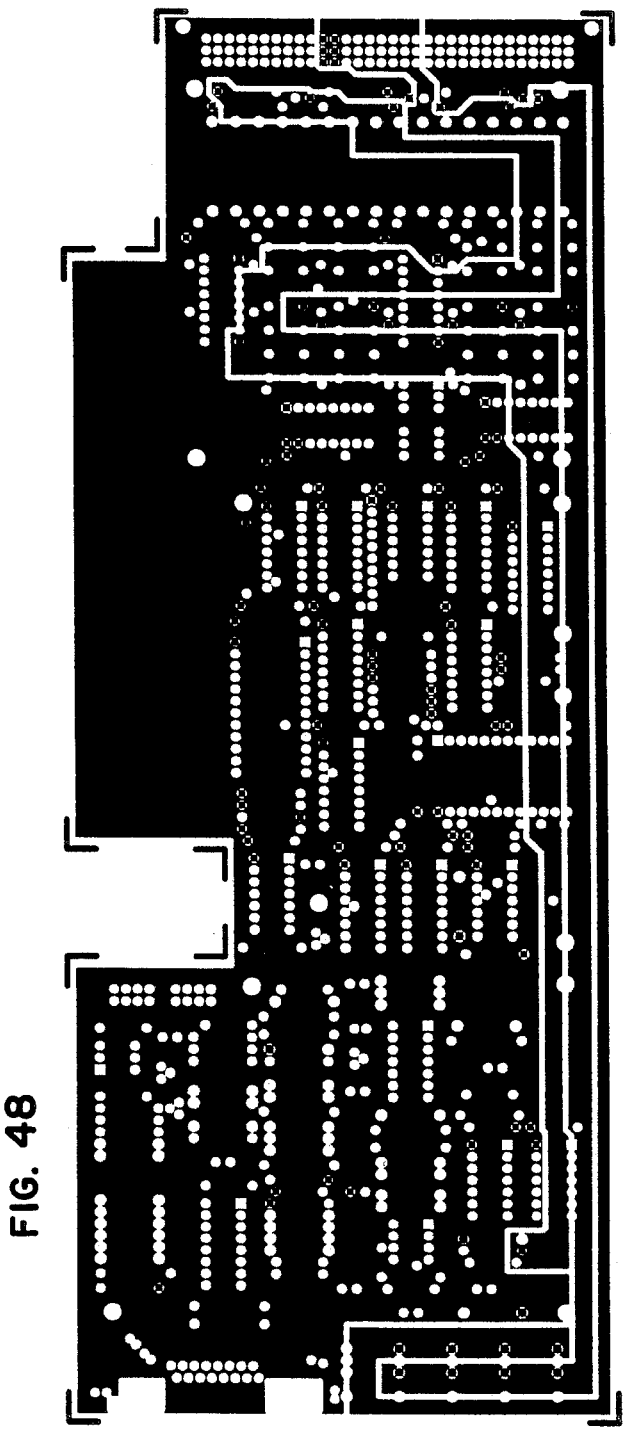

A further "signal" layer, consisting of the fifth layer in the board is shown in FIG. 47. This layer, like layer number two also includes a substantial signal ground plane area. It is important to note, although not readily apparent from the drawing, that the circuit board layout of the present invention separates as much as possible, as between the two signal routing layers, the runs corresponding to the transmit and receive circuits. This is believed to be beneficial in decoupling the transmit circuits, which are a dominant source of RF radiation, from the receive circuits whereby leakage of RF radiation from the transmit circuit through the receive circuits and out can be minimized. Furthermore, it has been found that the particular constant current fiber optic converter driver circuit of the present invention has also been quite useful in reducing excess RF radiation. The final layer of the board constituting the solder side of the board is similar in design to the first layer including a substantial chassis ground plane.

As indicated earlier, each of modules 100 includes a sheet metal support 201 to which the printed circuit board is mounted with standoffs 203. Standoffs 203 are connected to chassis ground on the printed circuit board whereby the support provides a further ground plane for wicking up stray RF.

Accordingly, the board design of the present invention provides for suppressing RF radiation internally to the interface chassis whereby a front panel containment cover is made unnecessary. It is believed that the multilayer ground-plane sandwiching of signal and interconnect layers is key to suppressing RF to the extent necessary to allow an uncovered front panel. Moreover, the present invention not only provides for an uncovered front panel, but also for an uncovered front panel port.

FIG. 42D shows the front panel 211 of module 100. Preferably connector 213 (P2) (FIG. 42C) is a shielded data link (SDL) connector which fits through aperture 215 in panel 211. Apertures 221 are provided for toggle switches 223, which are preferably tightly mounted to panel 211 with metal bushings. LED aperture 217, for fault indicator LED 219, is preferably made as small as possible to aid RF leakage therethrough. Screw-holes 227 are provided for the mounting screws.

Figure 51:
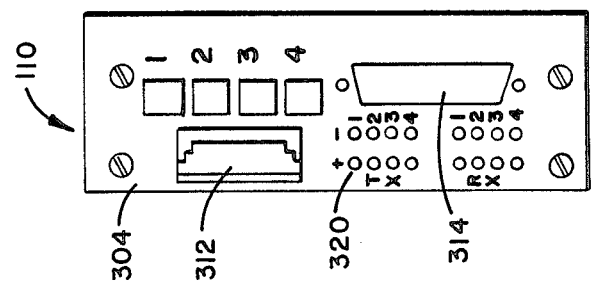
FIGS. 50-52 illustrate the test module according to the present invention.
Figure 50:
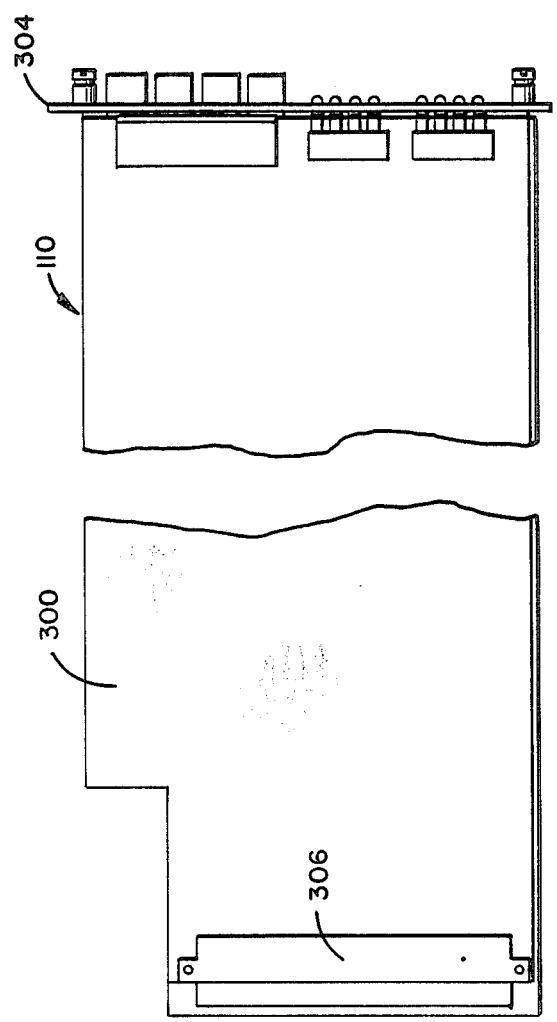
Figure 52:
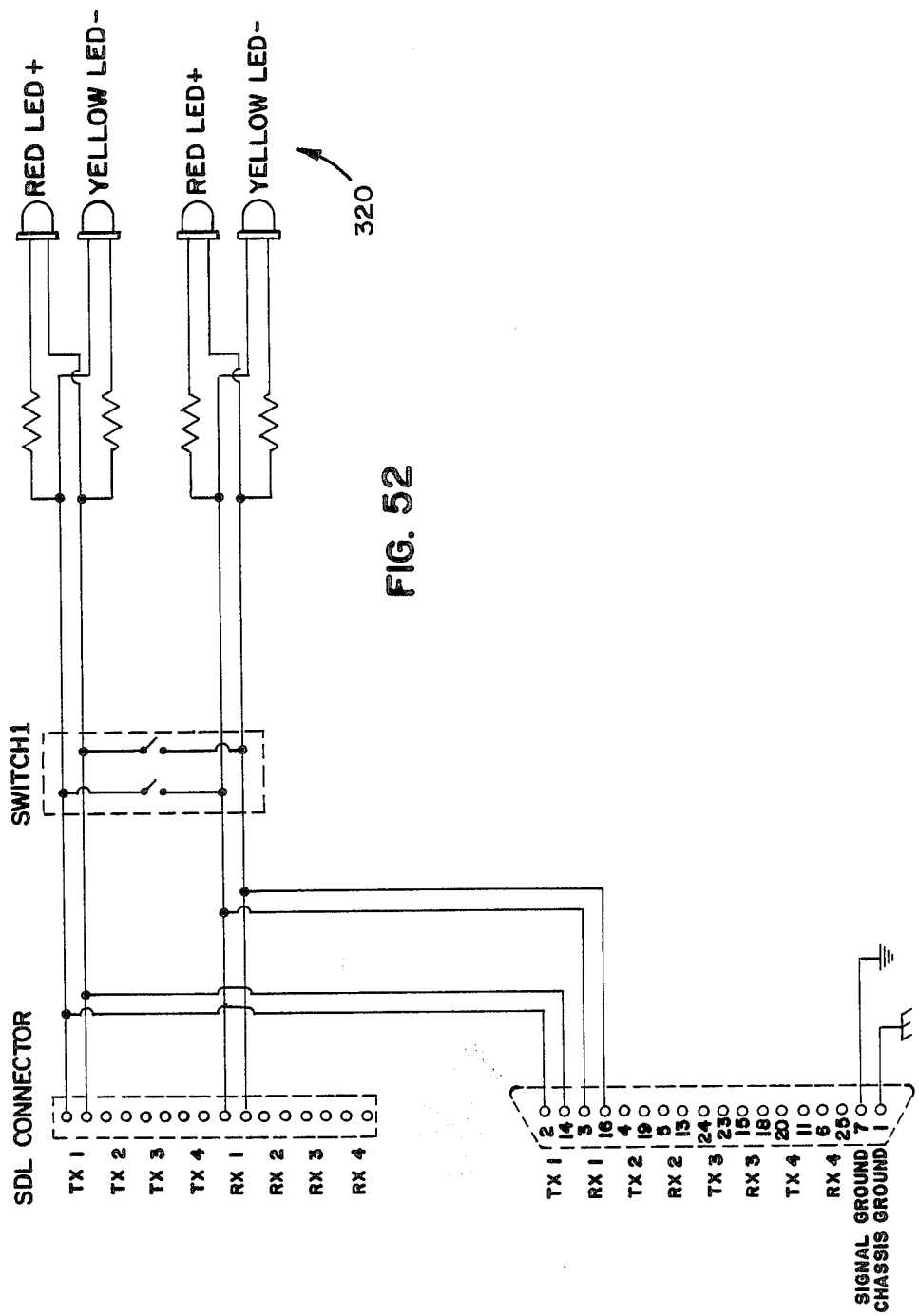

Referring now to FIGS. 50-52 the test module 110 according to the present invention will be described. The general mechanical features of module 110 are shown in FIGS. 50 and 51. Module 110 includes a circuit board 300, which may be of conventional design as noted hereinabove, to which is connected a front panel portion 304, preferably constructed of ferrous metal for shielding, and a rear connector 306, as required to mate with the motherboard connectors. Mounted on front panel 304 are four loop back switches 310, a monitor port, or jack, 312 and a further twenty five position D-subminiature connector 314. Also mounted on front panel 304 are a plurality of LED indicators 320, enough for monitoring four transmit and four receive channels, both sides.

The circuit schematic for module 110 is shown in FIG. 52. As shown, the basic elements of the circuit are the LEDs 320, the loop back switches 310 (not all are shown), and the two connectors 312 and 314 to which signals may be ported from another module, for instance the multiplexer module 50.

Thus, as described above, the present invention provides an electrical to fiber optic conversion unit characterized by low RF emissions while providing for the much desired unrestricted front panel access. Accordingly, the present invention overcomes the drawbacks of conventional prior art conversion units wherein security must be compromised in order to access the front panel of the conversion circuitry. Furthermore, the present invention provides that data security is not dependent upon the proper replacement of a front RF containment cover.

It is contemplated that modules for high speed data conversion, voice frequency multiplexing and telephone interfacing, together with corresponding test features may also be provided as one of modules 50, using the same circuit board approach taken with respect to the low-speed channel multiplexer modules 100. Furthermore, it is contemplated that a separate power supply chassis may be desirable in certain instances, with a separate chassis for conversion modules, whereby higher densities may be achieved.

Although the invention has been described herein in its preferred form, those skilled in the art will recognize that various modifications and changes may be made thereto without departing from the spirit and scope of the claims appended hereto.

I claim:

1. A low RF emission electrical to fiber optic conversion unit comprising:
   a chassis constructed of ferrous metal, said chassis including top and bottom walls, sidewalls and a rear wall and having an open front end;
   said chassis further including a plurality of card guides mounted to a pair of opposing walls internally thereof;
   a rear panel mounted inside said chassis, said panel having mounted thereto a motherboard printed circuit board including a plurality of connectors for receiving a cooperating mating connector;
   one or more conversion card modules for converting electrical signals to fiber optic signals, said modules including a first sheet metal support and a printed circuit card mounted thereto with a plurality of metal standoffs, said support sized to slide into said card guides on the top and bottom edges thereof, said support having affixed to one end thereof a front panel generally perpendicular thereto;
   said printed circuit board having a plurality of printed circuit layers, the top and bottom layers thereof substantially covered with chassis ground plane, wherein the chassis ground plane is a non DC or digital signal current conducting ground, said printed circuit board having mounted thereto a plurality of electrical components for carrying out said conversion, said components interconnected on one or more printed circuit layers sandwiched between said top and bottom layers; and panel means for covering the remaining open end of said chassis while leaving said front panel or panels uncovered.

2. A low RF emission electrical to fiber optic conversion unit comprising:

an RF signal containment chassis having an open front end;

one or more conversion card modules for converting between electrical signals and fiber optic signals, said modules each including a multilayered printed circuit board and support means for supporting said circuit board in said chassis, said support means including a front panel, said card module mounted in said chassis so that said front panel covers a portion of the front end of said chassis;

said printed circuit board having a plurality of printed circuit layers, at least one pair of said layers being substantially covered with chassis ground plane wherein the chassis ground plane is a non DC or digital signal current conducting ground, said printed circuit board having mounted thereto a plurality of electrical components for carrying out said signal conversion, said components interconnected to one or more printed circuit layers sandwiched between said pair of chassis ground plane layers; and panel means for covering the remaining open end of said chassis while leaving said one or more front panels of said conversion card modules uncovered.

3. The unit according to claim 2 wherein said one or more layers sandwiched between said pair of chassis ground plane layers include a plurality of traces interconnecting leads of said electrical components and wherein said traces are substantially surrounded by a plated signal ground plane.

4. The unit according to claim 2 wherein said electrical signals are carried to and from said card modules on a plurality of electrical conductors and wherein said front panel includes a access jack and wherein said printed circuit includes at least one interconnect layer sandwiched between said pair of ground plane layers for providing electrical signal paths from said electrical conductors to the access jack on the front panel thereof whereby said electrical conductors and their corresponding signals may be accessed from the front panel of said card module.

5. The unit according to claim 2 or 3 wherein said printed circuit includes at least one power supply layer including supply voltage traces sandwiched between said pair of layers for carrying one or more power supply voltages to said electrical components, and wherein said supply voltage traces are substantially surrounded by a grounded plating, said plating connected to the corresponding power supply grounds.

6. The unit according to claim 1 or 4 wherein said signal traces carrying receive and transmit data are separated from one another as much as possible to avoid crosstalk.

7. The unit according to claim 2 wherein said support means includes a planar metal member and wherein said circuit board is mounted in a parallel plane spaced apart from said metal member, and further wherein said metal member is connected to said chassis ground plane to provide a shield between adjacent conversion card modules mounted in the chassis.

8. The unit according to claim 7 wherein said chassis includes slot means for slideably receiving said support means into said chassis.

9. The unit according to claim 2, 7 or 8 wherein said card modules may be inserted side-by-side in said chassis to provide independent signal containing compartments and wherein the edges of said front panels of said card modules are sized to fit snugly against one another.

10. The unit according to claim 2 wherein said chassis includes a rear panel mounted in said chassis, and wherein said panel includes a motherboard including means for mating with one end of card modules mounted in said chassis.

11. The unit according to claim 10 wherein said motherboard includes a power distribution printed circuit layer having a plurality of traces for distributing power to said card modules from one or more power supplies.

12. The unit according to claim 10 wherein said motherboard includes an earth ground plane trace connected to an earth ground and wherein said ground plane trace is connected through said means for mating to the chassis ground plane layers on said card modules.

13. The unit according to claim 12 wherein said motherboard printed circuit board further includes a pair of chassis ground plane layers sandwiching said power distribution layer.

14. The unit according to claim 1 or 2 further including a cross-connect panel mounted inside said chassis for cross connecting incoming and outgoing electrical signal carrying wires to said card modules.

15. The unit according to claims 1 or 2 wherein said electrical signals comprise receive and transmit pairs and wherein said card modules further include one or more loopback switch means for electrically connecting corresponding receive and transmit pairs to allow for loop-back testing, and further wherein said switch means include a switching control accessible on said front panel.

16. The unit according to claim 1 or 2 wherein said electrical signals comprise receive and transmit pairs and wherein said card modules include means for multiplexing and means for demultiplexing a plurality of signals carried by said pairs onto and off of a fiber optic link, and further wherein said modules include an aggregate loopback switch means for electrically connecting the output of said means for multiplexing to the input of said means for demultiplexing whereby an aggregate loopback of all corresponding receive and transmit pairs through said means for multiplexing and said means for demultiplexing may be accomplished.

17. The unit according to claim 1 or 2 further including one or more test card modules mounted in said chassis, said test card modules including a front panel and positioned in said chassis so that said front panels cover a portion of the front end of said chassis and connectable via said front panel to said conversion card modules through the front panel connectors thereof and including means for performing test functions on signals from said conversion card modules.

18. The unit according to claim 1 or 2 wherein said chassis is constructed of two layers of sheet metal, each of said layers formed from 0.060 to 0.075 inch cold roller ferrous steel, and further wherein each of said sheet metal layers include aligned vent holes for venting the interior of said chassis, the diameter of said vent holes and the thickness of said vent holes as determined by the combined thickness of said two sheet metal layers sized to prevent high frequency signal radiation from escaping from the interior of said chassis.

19. The unit according to claim 18 wherein said vent holes are punched in said sheet metal layers.

20. The unit according to claim 1 or 2 wherein said chassis is constructed of two layers of bendable sheet metal, and further wherein at least one of said sheet metal layers on the top and bottom walls of said chassis is formed to include ears at right angles to the edges of the front end of said chassis for fastening the front panels of said card modules thereto, and further wherein said front panels of said card modules include means for fastening to said ears.

* * * * *

UNITED STATES PATENT AND TRADEMARK OFFICE
CERTIFICATE OF CORRECTION

PATENT NO. : 4,751,613

DATED : June 14, 1988

INVENTOR(S) : David A. Werdin et al.

It is certified that error appears in the above-identified patent and that said Letters Patent is hereby corrected as shown below:

IN THE SPECIFICATION:

Column 1, line 64, "accross" should be --across--.

Column 2, line 3, after "plane" please add --.--.

Column 3, line 59, "is" second occurrence should read --it--.

Column 4, line 7, "aperatures" should be --apertures--.

Column 6, line 41, "demuliplex" should be --demultiplex--.

Signed and Sealed this

Seventh Day of February, 1989

Attest:

DONALD J. QUIGG

Attesting Officer   Commissioner of Patents and Trademarks